United States Patent
Choi

(10) Patent No.: US 12,082,438 B2
(45) Date of Patent: Sep. 3, 2024

(54) DISPLAY PANEL INCLUDING COVERED INORGANIC ENCAPSULATION LAYER EDGE

(71) Applicant: Samsung Display Co., Ltd., Yongin-si (KR)

(72) Inventor: Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 437 days.

(21) Appl. No.: 17/310,466

(22) PCT Filed: Nov. 13, 2019

(86) PCT No.: PCT/KR2019/015436
§ 371 (c)(1),
(2) Date: Aug. 4, 2021

(87) PCT Pub. No.: WO2020/166793
PCT Pub. Date: Aug. 20, 2020

(65) Prior Publication Data
US 2022/0020957 A1    Jan. 20, 2022

(30) Foreign Application Priority Data
Feb. 15, 2019 (KR) .......................... 10-2019-0017971

(51) Int. Cl.
*H10K 50/84* (2023.01)
*H10K 50/81* (2023.01)
(Continued)

(52) U.S. Cl.
CPC ........... *H10K 50/844* (2023.02); *H10K 59/12* (2023.02); *H10K 59/65* (2023.02);
(Continued)

(58) Field of Classification Search
CPC .... H10K 50/844; H10K 50/80; H10K 50/805; H10K 50/84; H10K 50/868;
(Continued)

(56) References Cited

U.S. PATENT DOCUMENTS 9,105,871 B2    8/2015  Hamm
9,818,807 B2   11/2017  Park
(Continued)

FOREIGN PATENT DOCUMENTS

CN    101026228 A    8/2007
CN    106887523 A    6/2017
(Continued)

OTHER PUBLICATIONS

International Search Report for corresponding Application No. PCT/KR2019/015436 dated Feb. 17, 2020, 5pp.
(Continued)

*Primary Examiner* — Ida M Soward
(74) *Attorney, Agent, or Firm* — Lewis Roca Rothgerber Christie LLP

(57) ABSTRACT

A display panel includes: a substrate including a first area, a second area at least partially surrounding the first area, and an intermediate area between the first area and the second area; an insulating layer on the substrate; a plurality of display elements in the second area, and each including a pixel electrode, an opposite electrode, and an intermediate layer between the pixel electrode and the opposite electrode; a groove in the intermediate area; a thin-film encapsulation layer covering the plurality of display elements, and including an inorganic encapsulation layer and an organic encapsulation layer; and an inorganic layer over the thin-film encapsulation layer, wherein at least one sub-layer included in the intermediate layer is disconnected around the groove, and the inorganic layer directly contacts the insulating layer (Continued)

beyond an edge of the at least one sub-layer located in the intermediate area and an edge of the inorganic encapsulation layer.

25 Claims, 25 Drawing Sheets

(51) Int. Cl.
| | |
|---|---|
| *H10K 50/82* | (2023.01) |
| *H10K 50/844* | (2023.01) |
| *H10K 50/86* | (2023.01) |
| *H10K 59/12* | (2023.01) |
| *H10K 59/38* | (2023.01) |
| *H10K 59/40* | (2023.01) |
| *H10K 59/65* | (2023.01) |
| *G02F 1/1333* | (2006.01) |
| *H10K 50/80* | (2023.01) |
| *H10K 50/818* | (2023.01) |
| *H10K 50/828* | (2023.01) |
| *H10K 50/842* | (2023.01) |
| *H10K 59/121* | (2023.01) |
| *H10K 59/122* | (2023.01) |
| *H10K 59/124* | (2023.01) |

(52) U.S. Cl.
CPC ...... *G02F 1/133331* (2021.01); *H10K 50/818* (2023.02); *H10K 50/828* (2023.02); *H10K 50/8426* (2023.02); *H10K 50/865* (2023.02); *H10K 50/868* (2023.02); *H10K 59/1216* (2023.02); *H10K 59/122* (2023.02); *H10K 59/124* (2023.02); *H10K 59/38* (2023.02); *H10K 59/40* (2023.02)

(58) Field of Classification Search
CPC .......... H10K 50/865; H10K 50/8426; H10K 50/818; H10K 50/828; H10K 59/12; H10K 59/65; H10K 59/124; H10K 59/00; H10K 59/40; H10K 59/38; H10K 59/1216; H10K 59/122; H10K 2102/00; G02F 1/133331

See application file for complete search history.

(56) References Cited

U.S. PATENT DOCUMENTS

| | | | |
|---|---|---|---|
| 9,905,612 B2 | 2/2018 | Kwon et al. | |
| 9,985,241 B2 | 5/2018 | Koshihara et al. | |
| 10,312,298 B2 | 6/2019 | Oh | |
| 10,361,395 B2* | 7/2019 | Kajiyama | H10K 50/844 |
| 2007/0194711 A1 | 8/2007 | Matsuura et al. | |
| 2014/0138634 A1 | 5/2014 | Lee et al. | |
| 2014/0217397 A1* | 8/2014 | Kwak | H01L 27/124 257/43 |
| 2015/0021565 A1* | 1/2015 | Min | H10K 59/12 257/40 |
| 2016/0064691 A1 | 3/2016 | Lee et al. | |
| 2016/0204373 A1 | 7/2016 | Park | |
| 2016/0254335 A1 | 9/2016 | Lee et al. | |
| 2017/0148856 A1* | 5/2017 | Choi | H10K 59/124 |
| 2017/0200775 A1* | 7/2017 | Kim | H10K 59/88 |
| 2017/0205661 A1* | 7/2017 | Park | G02F 1/1368 |
| 2017/0262109 A1* | 9/2017 | Choi | H10K 50/844 |
| 2017/0277288 A1* | 9/2017 | Choi | H10K 50/844 |
| 2018/0033980 A1 | 2/2018 | Park et al. | |
| 2018/0040672 A1* | 2/2018 | Park | G06F 3/0412 |
| 2018/0053816 A1 | 2/2018 | Choi et al. | |
| 2018/0095571 A1 | 4/2018 | Park et al. | |
| 2018/0151834 A1 | 5/2018 | Kanaya | |
| 2018/0183015 A1 | 6/2018 | Yun et al. | |
| 2018/0190934 A1 | 7/2018 | Choi et al. | |
| 2018/0342700 A1* | 11/2018 | Cai | H10K 59/1213 |
| 2018/0366586 A1* | 12/2018 | Son | H01L 27/1218 |
| 2019/0051859 A1* | 2/2019 | Choi | H10K 59/123 |

FOREIGN PATENT DOCUMENTS

| | | | | | |
|---|---|---|---|---|---|
| CN | 107885383 | A | | 4/2018 | |
| CN | 108257973 | A | | 7/2018 | |
| CN | 108649133 | A | | 10/2018 | |
| CN | 109326740 | A | | 2/2019 | |
| EP | 3441845 | A1 | * | 2/2019 | .......... G06F 1/1637 |
| JP | 5782074 | B2 | | 9/2015 | |
| JP | 2017-147051 | A | | 8/2017 | |
| KR | 10-2014-0064136 | A | | 5/2014 | |
| KR | 10-2016-0017271 | A | | 2/2016 | |
| KR | 10-2016-0087982 | A | | 7/2016 | |
| KR | 10-1667800 | B1 | | 10/2016 | |
| KR | 10-2017-0059864 | A | | 5/2017 | |
| KR | 10-2017-0106621 | A | | 9/2017 | |
| KR | 10-2018-0013262 | A | | 2/2018 | |
| KR | 10-2018-0014378 | A | | 2/2018 | |
| KR | 10-2018-0036882 | A | | 4/2018 | |
| TW | 201818538 | A | | 5/2018 | |

OTHER PUBLICATIONS

Chinese Office Action dated Mar. 20, 2024, issued in Chinese Patent Application No. 201980092094.0, 9 pages.

* cited by examiner

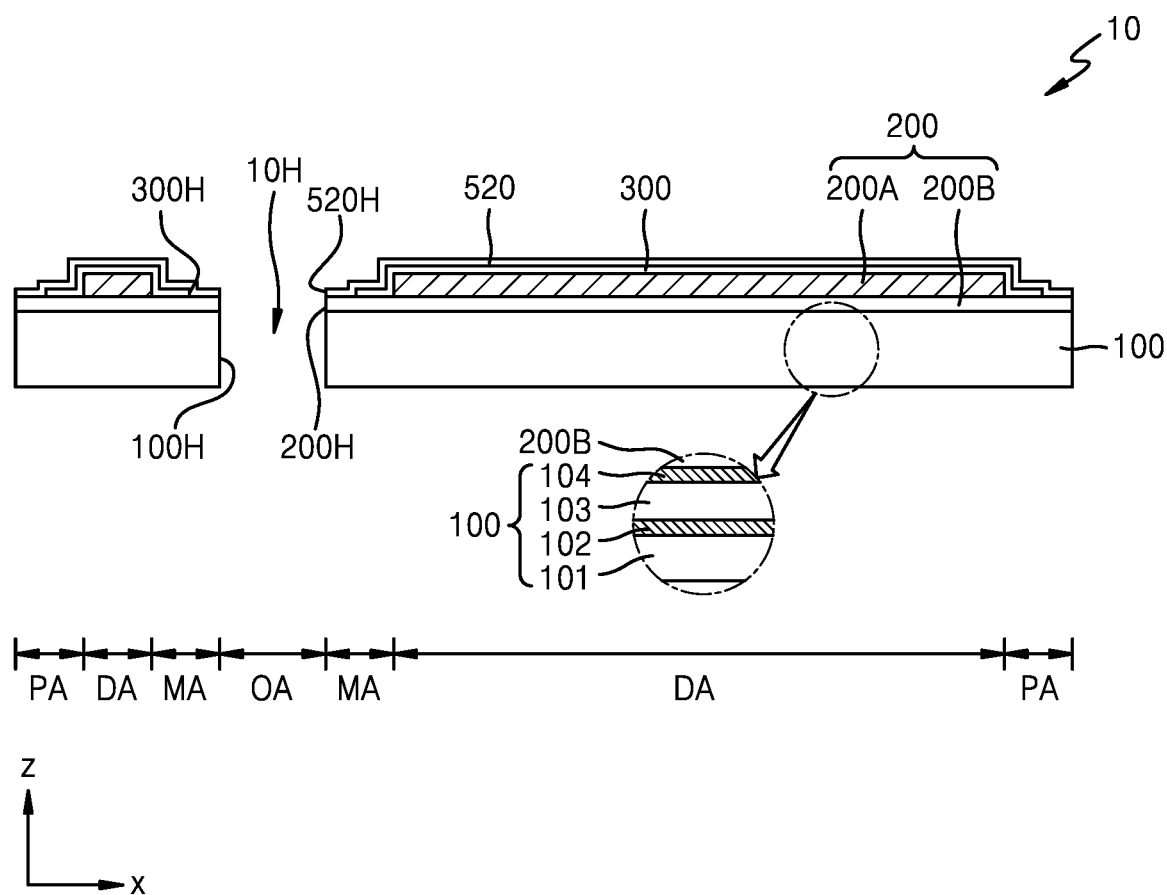

DISPLAY PANEL INCLUDING COVERED INORGANIC ENCAPSULATION LAYER EDGE

CROSS-REFERENCE TO RELATED APPLICATIONS

The present application is a U.S. National Phase Patent Application of International Patent Application Number PCT/KR2019/015436, filed on Nov. 13, 2019, which claims priority to Korean Patent Application Number 10-2019-0017971, filed on Feb. 15, 2019, the entire content of each of which is incorporated herein by reference.

TECHNICAL FIELD

One or more embodiments relate to a display panel having a first area inside a display area thereof, and a display device including the same.

BACKGROUND

Recently, the usage of a display device has diversified. In addition, as the display device have become thinner and lighter, the range of use thereof has expanded.

As the proportion of a display area in a display device has been expanded, various functions combined with or linked to display devices have been added. As a way to add various functions to a display device while expanding a display area, there is ongoing research on a display device that has a display area in which various elements may be arranged.

The above information disclosed in this Background section is only for enhancement of understanding of the background and therefore the information discussed in this Background section does not necessarily constitute prior art.

DESCRIPTION OF EMBODIMENTS

Technical Problem

Aspects of some embodiments of the present disclosure may include a display panel having a first area in which components of various types may be arranged, and a display device including the same. However, this characteristic is only an example, and does not limit the scope of the present disclosure.

Solution to Problem

According to some embodiments, a display panel includes a substrate including a first area, a second area at least partially surrounding the first area, and an intermediate area between the first area and the second area, an insulating layer on the substrate, a plurality of display elements located in the second area, and each including a pixel electrode, an opposite electrode, and an intermediate layer between the pixel electrode and the opposite electrode, a groove in the intermediate area, a thin-film encapsulation layer covering the plurality of display elements, and including an inorganic encapsulation layer and an organic encapsulation layer, and an inorganic layer over the thin-film encapsulation layer, wherein at least one sub-layer included in the intermediate layer is disconnected around the groove, and the inorganic layer directly contacts the insulating layer beyond an edge of the at least one sub-layer and an edge of the inorganic encapsulation layer that are located in the intermediate area.

The insulating layer may include an inorganic insulating material. The opposite electrode may be disconnected around the groove.

The edge of the at least one sub-layer, an edge of the opposite electrode, and the edge of the inorganic encapsulation layer may be spaced apart from the first area.

A portion of the organic encapsulation layer may be in the groove.

The at least one sub-layer may include at least one of a hole transport layer, a hole injection layer, an electron transport layer, or an electron injection layer.

The display panel may further include a cover layer below the inorganic layer and covering the edge of the at least one sub-layer and the edge of the inorganic encapsulation layer.

The cover layer may include an organic insulating material.

In a plan view, the cover layer may have a ring shape that surrounds the first area.

An angle of an inclined surface of the cover layer covering the edge of the at least one sub-layer and the edge of the inorganic encapsulation layer may be less than an angle of an inclined surface formed by the edge of the at least one sub-layer and the edge of the inorganic encapsulation layer.

The display panel may further include a transparent layer between the inorganic layer and the thin-film encapsulation layer.

The thin-film encapsulation layer may further include an upper inorganic encapsulation layer on the inorganic encapsulation layer with the organic encapsulation layer therebetween, and an edge of the upper inorganic encapsulation layer may form a step with the edge of the inorganic encapsulation layer.

According to some embodiments, a display panel includes a substrate including a first area, a second area at least partially surrounding the first area, and an intermediate area between the first area and the second area, an insulating layer on the substrate, a plurality of display elements located in the second area, and each including a pixel electrode, an opposite electrode, and an intermediate layer between the pixel electrode and the opposite electrode, a groove in the intermediate area, a thin-film encapsulation layer covering the plurality of display elements, and an inorganic layer over the thin-film encapsulation layer, wherein at least one sub-layer included in the intermediate layer is disconnected around the groove, and the inorganic layer extends toward the first area beyond an edge of the at least one sub-layer and an edge of the thin-film encapsulation layer that are located in the intermediate layer.

The thin-film encapsulation layer may include a first inorganic encapsulation layer, an organic encapsulation layer on the first inorganic encapsulation layer, and a second inorganic encapsulation layer on the organic encapsulation layer, and the inorganic layer may directly contact the insulating layer beyond an edge of the first inorganic encapsulation layer and an edge of the second inorganic encapsulation layer.

An edge of the organic encapsulation layer may be closer to the second area than the edge of the first inorganic encapsulation layer and the edge of the second inorganic encapsulation layer.

The edge of the second inorganic encapsulation layer may form a step with the edge of the first inorganic encapsulation layer.

The at least one sub-layer may include at least one of a hole transport layer, a hole injection layer, an electron transport layer, or an electron injection layer.

The opposite electrode may be disconnected around the groove, and an edge of the opposite electrode may be spaced apart from the first area by a distance.

The inorganic layer may cover the edge of the opposite electrode.

The display panel may further include a cover layer covering the edge of the thin-film encapsulation layer.

The cover layer may be between the inorganic layer and the edge of the thin-film encapsulation layer.

When viewed from a direction perpendicular to an upper surface of the substrate, the cover layer may have a ring shape that surrounds the first area.

When viewed from the direction perpendicular to the upper surface of the substrate, the cover layer may have a ring shape surrounding the first area, and the groove may be closer to the second area than the cover layer.

The display panel may further include a transparent layer between the inorganic layer and the thin-film encapsulation layer, and an edge of the transparent layer may be spaced apart from the first area.

The inorganic layer may cover the edge of the transparent layer.

Other aspects, features, and characteristics other than those described above will become apparent from the accompanying drawings, the appended claims, and the detailed description of the present disclosure.

A display panel according to one or more embodiments may prevent external impurities such as moisture from damaging a display area around a first area. However, this effect is an example, and the effect according to embodiments will be described in detail through the following description.

BRIEF DESCRIPTION OF DRAWINGS

FIGS. 4A to 4D are cross-sectional views schematically illustrating a display panel according to some embodiments.

MODE OF DISCLOSURE

Figure 1:
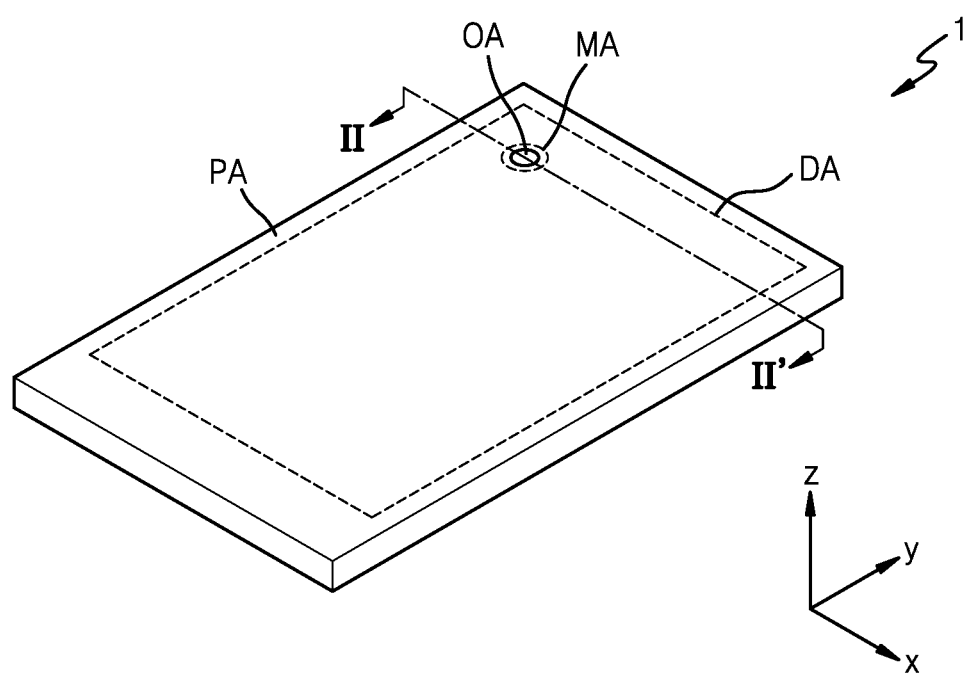
FIG. 1 is a perspective view schematically illustrating a display device according to some embodiments.

Because the present disclosure may have diverse modified embodiments, embodiments are illustrated in the drawings and are described with respect to the embodiments. An effect and characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

Hereinafter, embodiments will be described with reference to the accompanying drawings, wherein like reference symbols refer to like elements throughout the present disclosure and a repeated description thereof is omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, region, or element is referred to as being "formed on" another layer, area, or element, it can be directly or indirectly formed on the other layer, region, or element. That is, for example, one or more intervening layers, regions, or elements may be present therebetween.

In the drawings, sizes of components in the drawings may be exaggerated or contracted for convenience of explanation. In other words, because sizes and thicknesses of components in the drawings are arbitrarily illustrated for convenience of explanation, the following embodiments are not limited thereto.

When an embodiment may be implemented differently, a process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present therebetween. For example, when layers, areas, elements, or the like are referred to as being "electrically connected," they may be directly electrically connected, or layers, areas or elements may be indirectly electrically connected, and an intervening layer, region, component, or the like may be present therebetween.

FIG. 1 is a perspective view schematically illustrating a display device according to some embodiments.

Figure 2:
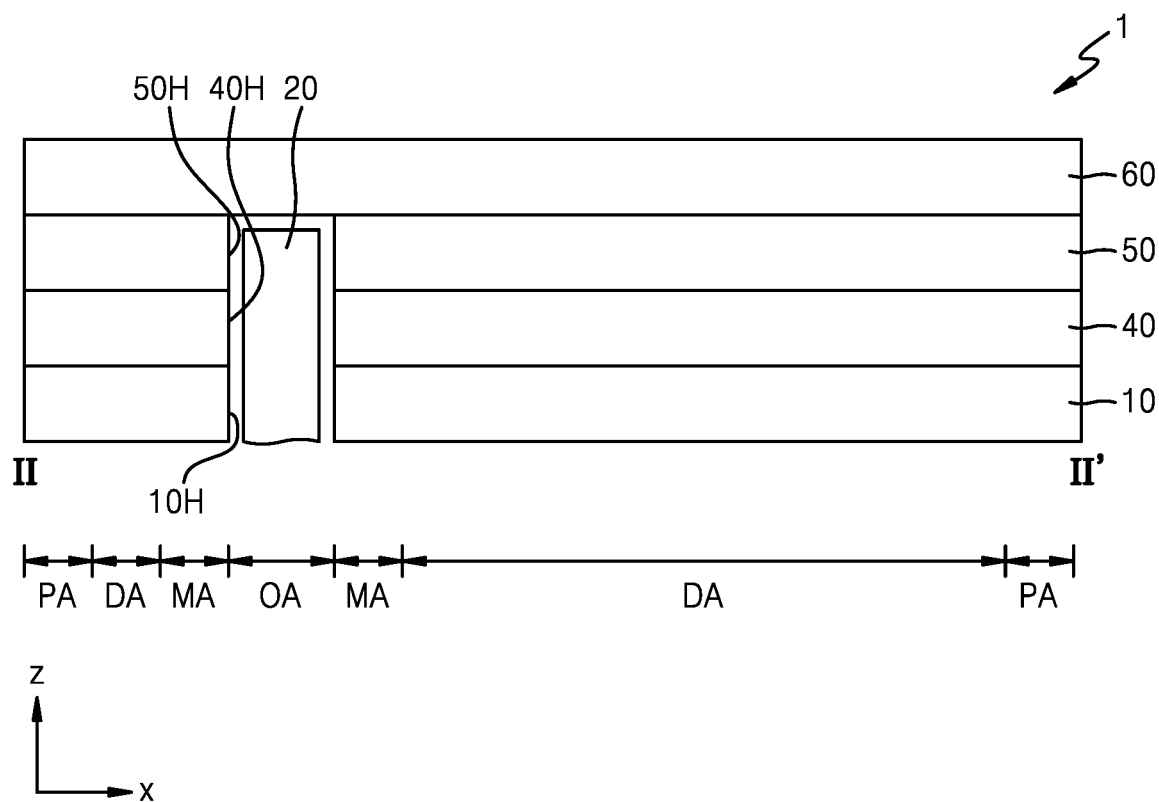
FIG. 2 is a cross-sectional view briefly illustrating a display device according to some embodiments.

Referring to FIG. 1, a display device 1 includes a first area OA and a display area DA that is a second area at least partially surrounding the first area OA. The display device 1 may provide an image by using light emitted from a plurality of pixels arranged in the display area DA. In some embodiments, FIG. 1 shows that one first area OA is arranged inside the display area DA, and the first area OA may be entirely surrounded by the display area DA. The first area OA may be an area in which a component to be described below with reference to FIG. 2 is arranged.

An intermediate area MA as a third area is arranged between the first area OA and the display area DA that is the second area, and the display area DA may be surrounded by an outer area PA, which is a fourth area. The intermediate area MA and the outer area PA may be a kind of non-display area in which no pixels are arranged. The intermediate area MA may be entirely surrounded by the display area DA, and the display area DA may be entirely surrounded by the outer area PA.

In the following description, an organic light-emitting display is described as an example of the display device 1 according to some embodiments, but the display device according to the present disclosure is not limited thereto. According to some embodiments, display devices of various types, such as inorganic light-emitting displays (or inorganic electroluminescent (EL) displays), quantum dot light-emitting displays, and the like, may be used. For example, an emission layer of a display element provided in the display device 1 may include an organic material, an inorganic material, quantum dots, an organic material and quantum dots, or an inorganic material and quantum dots.

In FIG. 1, one first area OA is provided and is substantially circular, but the present disclosure is not limited thereto. The number of first areas OA may be two or more, and a shape of each first area OA may be changed in various ways, such as a circle, an oval, a polygon, a star shape, a diamond shape, and the like.

Figure 3:
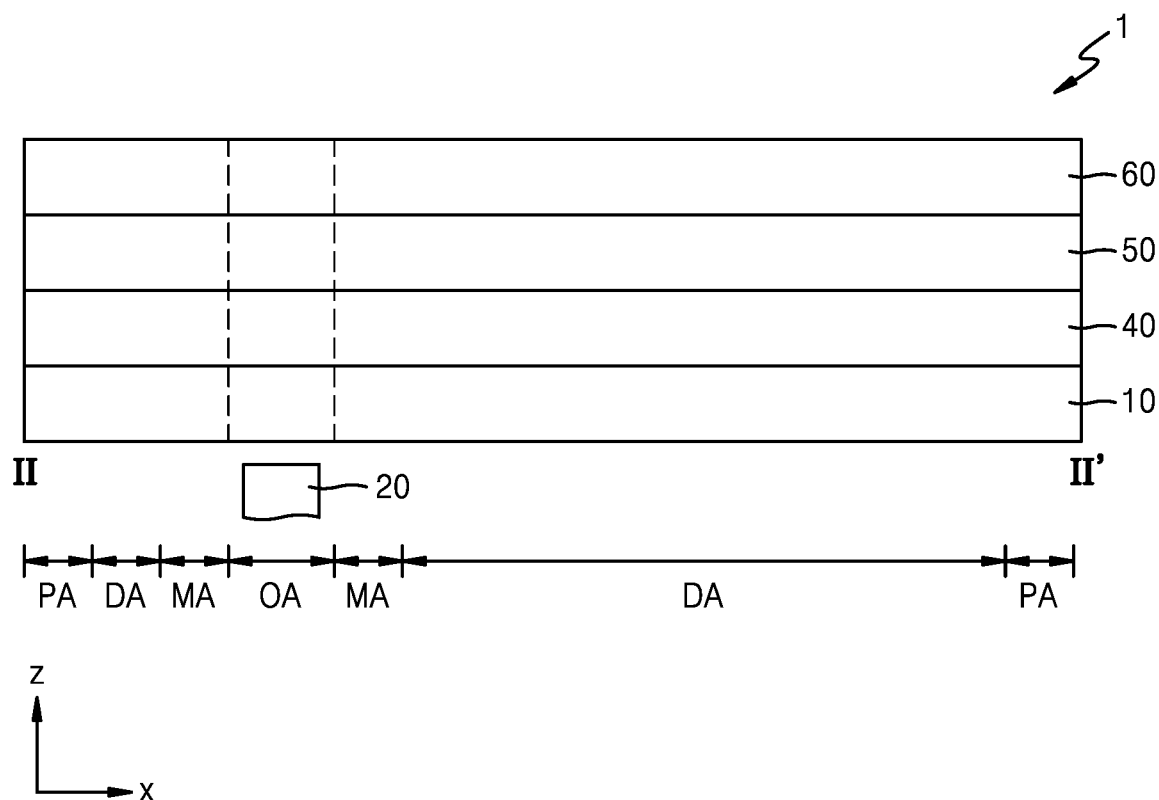
FIG. 3 is a cross-sectional view briefly illustrating a display device according to some embodiments.

FIG. 2 is a cross-sectional view briefly illustrating a display device, taken along the line II-II' in FIG. 1, according to some embodiments, and FIG. 3 is a cross-sectional view briefly illustrating a display device according to some embodiments.

Referring to FIG. 2, a display device 1 may include a display panel 10, an input-sensing layer 40 arranged on the display panel 10, and an optical functional layer 50, and these elements may be covered with a window 60. The display device 1 may be various electronic devices such as mobile phones, notebook computers, and smart watches.

The display panel 10 may display images. The display panel 10 includes pixels arranged in the display area DA. Each of the pixels may include a display element and a pixel circuit connected thereto. The display element may include an organic light-emitting diode, an inorganic light-emitting diode, a quantum dot light-emitting diode, or the like.

The input-sensing layer 40 may obtain coordinate information according to an external input, for example, a touch event. The input-sensing layer 40 may include a sensing electrode (or touch electrode) and trace lines connected to the sensing electrode. The input-sensing layer 40 may be arranged on the display panel 10. The input sensing layer 40 may sense an external input in a mutual capacitance method or/and a self-capacitance method.

The input-sensing layer 40 may be formed directly on the display panel 10 or may be formed separately and then bonded to the display panel 10 through an adhesive layer such as an optical clear adhesive (OCA). For example, the input-sensing layer 40 may be formed continuously after a process of forming the display panel 10 is performed, and in this case, the adhesive layer may not be located between the input-sensing layer 40 and the display panel 10. FIG. 2 shows that the input-sensing layer 40 is arranged between the display panel 10 and the optical functional layer 50, but according to some embodiments, the input-sensing layer 40 may be arranged over the optical functional layer 50.

The optical functional layer 50 may include an anti-reflection layer. The anti-reflection layer may reduce the reflectivity of light (external light) incident toward the display panel 10 from the outside through the window 60. The anti-reflection layer may include a retarder and a polarizer. The retarder may be of a film type or a liquid crystal-coating-type and may include a $\lambda/2$ retarder and/or a $\lambda/4$ retarder. The polarizer may also be a film-type polarizer or a liquid crystal-coating-type polarizer. The film-type polarizer may include a stretchable synthetic resin film, and the liquid crystal-type polarizer may include liquid crystals arranged in a certain arrangement. Each of the retarder and the polarizer may further include a protective film. The retarder and the polarizer themselves or the protective film may correspond to a base layer of the anti-reflection layer.

According to some embodiments, the anti-reflection layer may include a black matrix and color filters. The color filters may be arranged by taking into account a color of light emitted from each of the pixels of the display panel 10. Each of the color filters may include a red, green, or blue pigment or dye. Alternatively, each of the color filters may further include quantum dots in addition to the above-described pigment or dye. Alternatively, some of the color filters may not include the above-described pigment or dye, and may include scattering particles such as titanium oxide.

According to some embodiments, the anti-reflection layer may include a destructive interference structure. The destructive interference structure may include a first reflective layer and a second reflective layer, which are arranged on different layers from each other. First reflected light and second reflected light respectively reflected by the first reflective layer and the second reflective layer may destructively interfere with each other, and thus, the external light reflectivity may be reduced.

The optical functional layer 50 may include a lens layer. The lens layer may improve the emission efficiency of light emitted from the display panel 10 or may reduce color deviation. The lens layer may include a layer having a concave or convex lens shape and/or may include a plurality of layers having different refractive indices from each other. The optical functional layer 50 may include both the anti-reflection layer and the lens layer described above, or may include one of them.

The display panel 10, the input-sensing layer 40, and/or the optical functional layer 50 may include an opening. According to some embodiments, FIG. 2 shows that the display panel 10, the input-sensing layer 40, and the optical functional layer 50 include first to third openings 10H, 40H, and 50H, respectively, wherein the first to third openings 10H, 40H, and 50H overlap one another. The first to third openings 10H, 40H, and 50H may be located to correspond to a first area OA. According to some embodiments, at least one of the display panel 10, the input-sensing layer 40, or the optical functional layer 50 may not include an opening. For example, one or two of the display panel 10, the input-sensing layer 40, and the optical functional layer 50 may not include an opening. Alternatively, the display panel 10, the input-sensing layer 40, and the optical functional layer 50 may not include an opening, as shown in FIG. 3.

The first area OA may be a kind of component area (e.g., a sensor area, a camera area, a speaker area, etc.) in which a component 20 for adding various functions to the display device 1 is arranged. The component 20 may be within the first to third openings 10H, 40H, and 50H, as shown in FIG. 2. Alternatively, the component 20 may be arranged under the display panel 10, as shown in FIG. 3.

The component 20 may include an electronic element. For example, the component 20 may be an electronic element using light or sound. For example, the electronic element may include a sensor that uses light, such as an infrared sensor, a camera that receives light and captures an image, a sensor that outputs and senses light or sound to measure a distance or recognize a fingerprint, a small lamp that outputs light, a speaker that outputs sound, and the like. In a case of an electronic element that uses light, light in various wavelength bands, such as visible light, infrared light, and ultraviolet light, may be used. In a case of an electronic element that uses sound, light in an ultrasonic band or other various frequency bands may be used. In some embodiments, the first area OA may correspond to a transmission area through which light or/and sound output from the component 20 to the outside or progressing toward an electronic element from the outside may pass.

According to some embodiments, when the display device 1 is used as a smartwatch or an instrument panel for a vehicle, the component 20 may be an element such as clock hands or a needle indicating information (e.g., the velocity of a vehicle, etc.). When the display device 1 includes a clock hand or an instrument panel for a vehicle, the component 20 may pass through the window 60 and be exposed to the outside, and the window 60 may include an opening corresponding to the first area OA.

As described above, the component 20 may include element(s) associated with functions of the display panel 10, or may include an element such as an accessory that improves the aesthetics of the display panel 10, etc. According to some embodiments, a layer including an OCA, etc. may be between the window 60 and the optical functional layer 50.

FIGS. 4A to 4D are cross-sectional views schematically illustrating a display panel according to some embodiments.

Referring to FIG. 4A, a display panel 10 includes a display layer 200 arranged on a substrate 100. The substrate 100 may include a glass material or a polymer resin. The substrate 100 may be formed in multiple layers. For example, as shown in the enlarged view of FIG. 4A, the substrate 100 may include a first base layer 101, a first barrier layer 102, a second base layer 103, and a second barrier layer 104.

Each of the first and second base layers 101 and 103 may include a polymer resin. For example, the first and second base layers 101 and 103 may include a polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate, cellulose triacetate (TAC), cellulose acetate propionate (CAP), and the like. The polymer resin may be transparent.

Each of the first and second barrier layers 102 and 104 may be a barrier layer that prevents the penetration of foreign substances, and may be a single layer or multiple layers including an inorganic material such as silicon nitride ($SiN_x$, x>0) and silicon oxide ($SiO_x$, x>0).

The display layer 200 includes a plurality of pixels. The display layer 200 may include a display element layer 200A and a pixel circuit layer 200B, wherein the display element layer 200A includes display elements arranged for each pixel, and the pixel circuit layer 200B includes a pixel circuit arranged for each pixel, and insulating layers. Each pixel circuit may include a thin-film transistor and a storage capacitor, and each of the display elements may include an organic light-emitting diode (OLED).

The display elements of the display layer 200 may be covered with an encapsulation member such as a thin-film encapsulation layer 300, and an inorganic layer 520 may be arranged on the thin-film encapsulation layer 300. The inorganic layer 520 may cover an edge (or end) of the thin-film encapsulation layer 300 in an intermediate area MA. The inorganic layer 520 may extend further toward a first area OA than the edge of the thin-film encapsulation layer 300 in the intermediate area MA, and contact a layer arranged below the edge of the thin-film encapsulation layer 300. The inorganic layer 520 may include an inorganic insulating material, and the inorganic insulating material may include, for example, silicon nitride, silicon oxide, silicon oxynitride, and the like.

When the display panel 10 includes the substrate and the thin-film encapsulation layer, which are multiple layers, the flexibility of the display panel 10 may be improved. The display panel 10 may include a first opening 10H that penetrates through the display panel 10. The first opening 10H may be located in the first area OA, and in this case, the first area OA may be a kind of opening area.

FIG. 4A shows that the substrate 100, the thin-film encapsulation layer 300, and the inorganic layer 520 respectively include through holes 100H, 300H, and 520H each corresponding to the first opening 10H of the display panel 10. The display layer 200 may also include a through hole 200H corresponding to the first area OA.

Figure 4B:
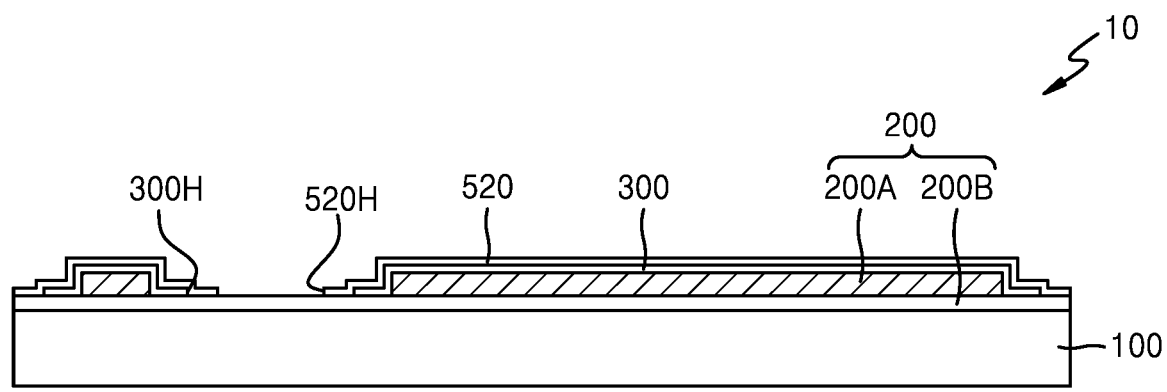
Figure 4B:
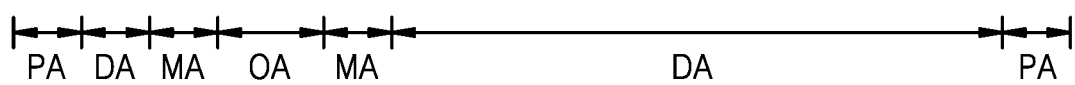
Figure 4B:
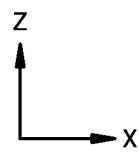

According to some embodiments, as shown in FIG. 4B, the substrate 100 may not include a through hole corresponding to the first area OA. The display element layer 200A may not be located in the first area OA, and the pixel circuit layer 200B may be arranged in the first area OA. The thin-film encapsulation layer 300 may include the through hole 300H corresponding to the first area OA. As shown in FIG. 4B, the inorganic layer 520 may include the through hole 520H corresponding to the first area OA, or as shown in FIG. 4C, may cover the first area OA without a through hole.

Figure 4C:
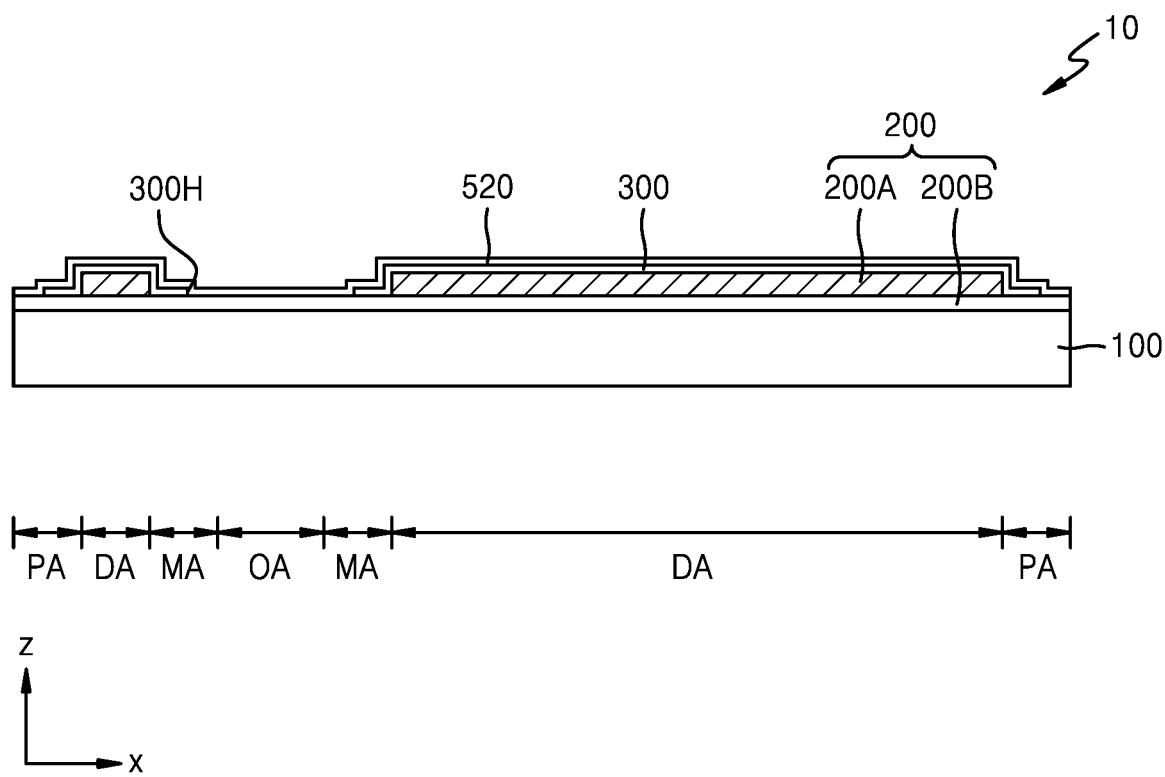
Figure 4D:
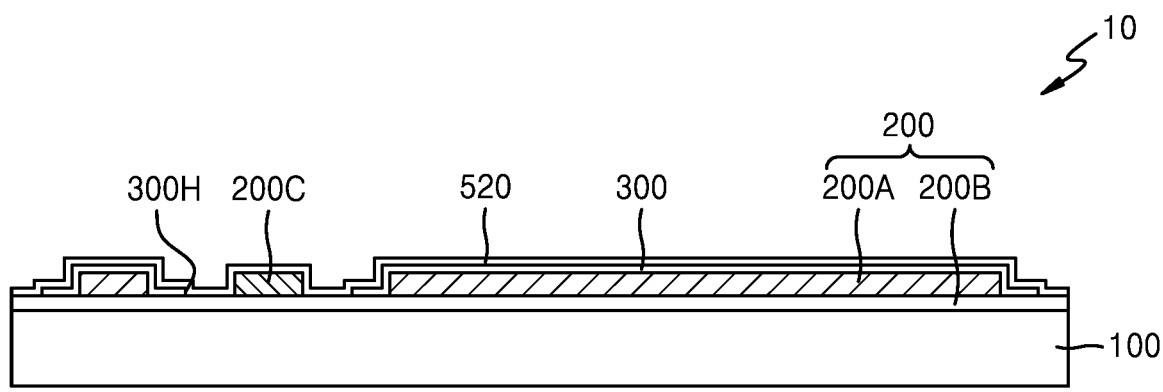
Figure 4D:
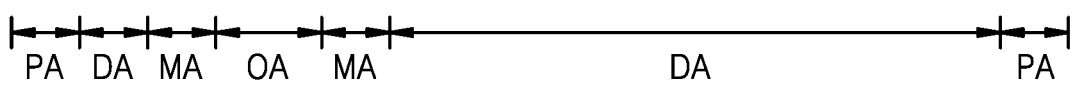
Figure 4D:
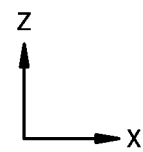

FIGS. 4A to 4C show that the display element layer 200A is not arranged in the first area OA, but the present disclosure is not limited thereto. According to some embodiments, as shown in FIG. 4D, an auxiliary display element layer 200C may be located in the first area OA. The auxiliary display element layer 200C may include a display element that has a different structure and/or operates in a different manner from a display element of the display element layer 200A. According to some embodiments, each pixel of the display element layer 200A may include an active organic light-emitting diode, and the auxiliary display element layer 200C may include pixels including a passive organic light-emitting diode. When the auxiliary display element layer 200C includes a passive organic light-emitting diode as a display element, elements constituting a pixel circuit may not be under the display element. For example, a portion of the pixel circuit layer 200B, which located under the auxiliary display element layer 200C, may not have transistors and storage capacitors, even if transistors and storage capacitors are arranged for each pixel.

According to some embodiments, the auxiliary display element layer 200C may have a display element of the same type (e.g., an active organic light-emitting diode) as the display element of the display element layer 200A, but pixel circuits therebelow may have different structures from each other. For example, a pixel circuit below the auxiliary display element layer 200C (e.g., a pixel circuit having a light-shielding film between a substrate and a transistor) may include a different structure from a pixel circuit below the display element layer 200A. Alternatively, the display elements of the auxiliary display element layer 200C may operate according to a control signal different from that of the display elements of the display element layer 200A.

A component that does not require relatively high transmittance (e.g., infrared sensors, etc.) may be arranged in the first area OA where the auxiliary display element layer 200C is arranged. In this case, the first area OA may be a component area and an auxiliary display area. The display element layer 200A may be covered with the thin-film encapsulation layer 300, and the inorganic layer 520 may cover the thin-film encapsulation layer 300. The inorganic layer 520 may extend further than the thin-film encapsulation layer 300 in the intermediate area MA. The inorganic layer 520 may also cover the auxiliary display element layer 200C of the first area OA. According to some embodiments, an encapsulation layer covering the auxiliary display element layer 200C may be arranged between the auxiliary display element layer 200C and the inorganic layer 520, and the encapsulation layer on the auxiliary display element layer 200C and the thin-film encapsulation layer 300 on the display element layer 200A may have same structures as or different structures from each other.

Figure 5:
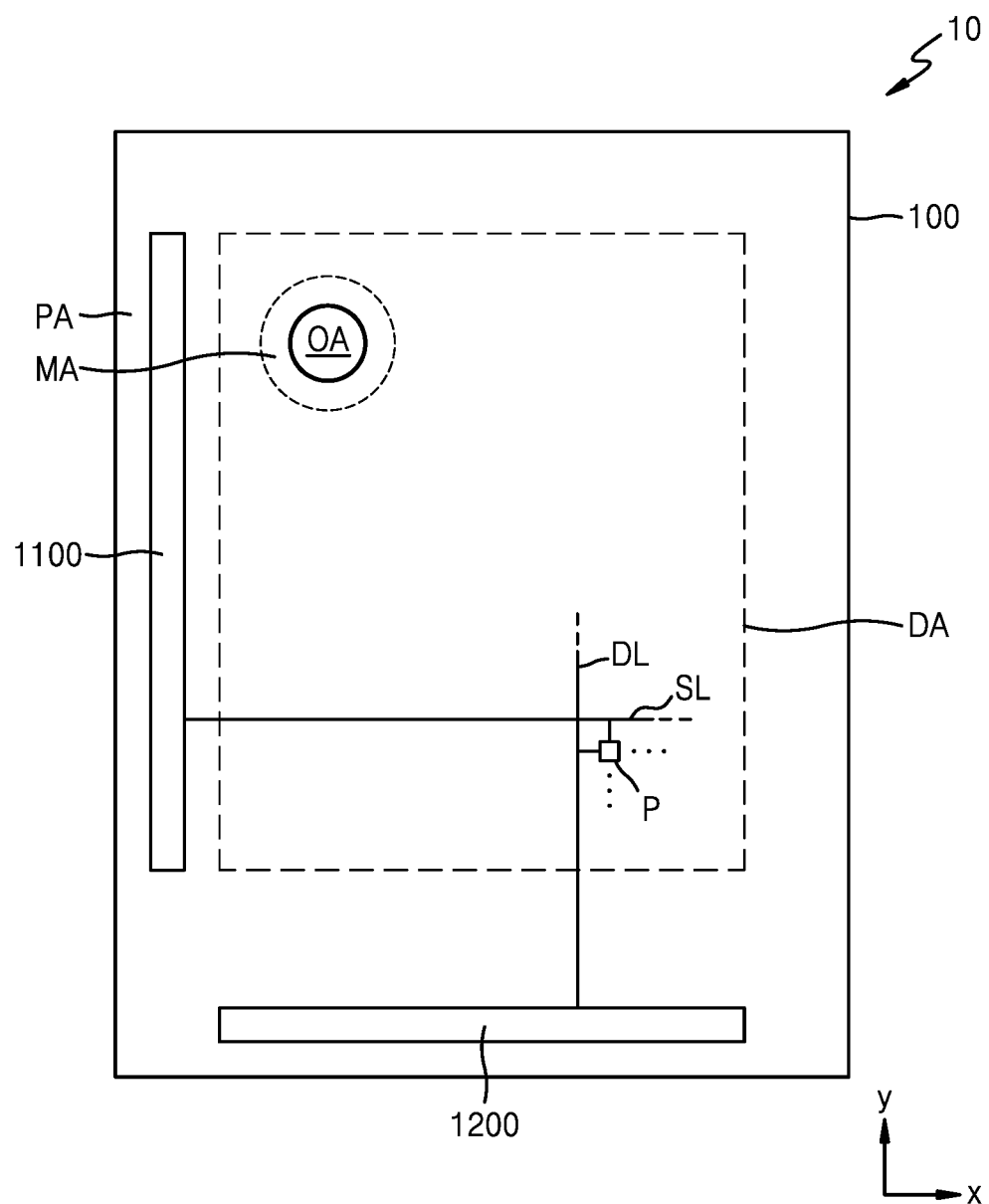
FIG. 5 is a plan view schematically illustrating a display panel according to some embodiments.
Figure 6:
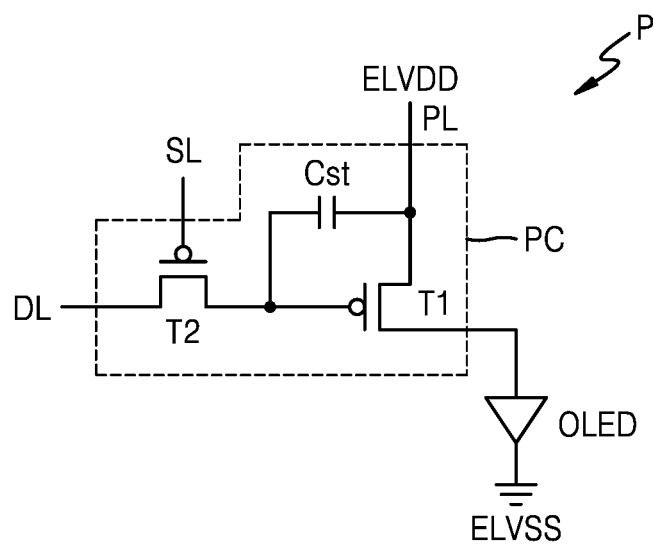
FIG. 6 is an equivalent circuit diagram schematically illustrating a pixel of a display panel according to some embodiments.

FIG. 5 is a plan view schematically illustrating a display panel according to some embodiments, and FIG. 6 is an equivalent circuit diagram schematically illustrating a pixel of the display panel according to some embodiments.

Referring to FIG. 5, a display panel 10 may include a display area DA, a first area OA, an intermediate area MA, and an outer area PA. FIG. 5 shows a substrate 100 of the display panel 10. For example, the substrate 100 may have the display area DA, the first area OA, the intermediate area MA, and the outer area PA. Alternatively, the substrate 100 may have areas respectively corresponding to the display panel 10, the first area OA, the intermediate area MA, and the outer area PA of the display panel 10.

The display panel 10 may include a plurality of pixels P arranged in the display area DA. As shown in FIG. 6, each of the pixels P may include a pixel circuit PC and an organic light-emitting diode OLED as a display element connected to the pixel circuit PC. The pixel circuit PC may include a first thin-film transistor T1, a second thin-film transistor T2, and a storage capacitor Cst. For example, each of the pixels P may emit one of red light, green light, and blue light by the organic light-emitting diode OLED, or may emit one of red light, green light, blue light, and white light by the organic light-emitting diode OLED.

The second thin-film transistor T2, which is a switching thin-film transistor, is connected to a scan line SL and a data line DL and may transfer a data voltage received from the data line DL to the first thin-film transistor T1 according to a switching voltage received from the scan line SL. The storage capacitor Cst is connected to the second thin-film transistor T2 and a driving voltage line PL and may store a voltage corresponding to a voltage difference between the data voltage received from the second thin-film transistor T2 and a first power voltage ELVDD applied to the driving voltage line PL.

The first thin-film transistor T1, which is a driving thin-film transistor, is connected to the driving voltage line PL and the storage capacitor Cst and may control a driving current flowing from the driving voltage line PL to the organic light-emitting diode OLED corresponding to a voltage stored in the storage capacitor Cst. The organic light-emitting diode OLED may emit light having a luminance according to the driving current. An opposite electrode (e.g., a cathode) of the organic light-emitting diode OLED may receive a second power voltage ELVSS.

Although FIG. 6 shows that the pixel circuit PC includes two thin-film transistors and one storage capacitor, the present disclosure is not limited thereto. The number of thin-film transistors and/or the number of storage capacitors may vary according to the design of the pixel circuit PC.

Referring to FIG. 5 again, the intermediate area MA may surround the first area OA. The intermediate area MA is an area in which a display element such as an organic light-emitting diode emitting light is not arranged, and signal lines configured to provide signals to pixels P arranged around the first area OA may pass through the intermediate area MA. A scan driver 1100 configured to provide a scan signal to each of the pixels P, a data driver 1200 configured to provide a data signal to each of the pixels P, and a main power line configured to provide the first and second power voltages, etc. may be arranged in the outer area PA. FIG. 5 shows that the data driver 1200 is arranged adjacent to one side of the substrate 100. However, according to some embodiments, the data driver 1200 may be arranged on a flexible printed circuit board (FPCB) that is electrically connected to a pad arranged at one side of the display panel 10.

Figure 7:
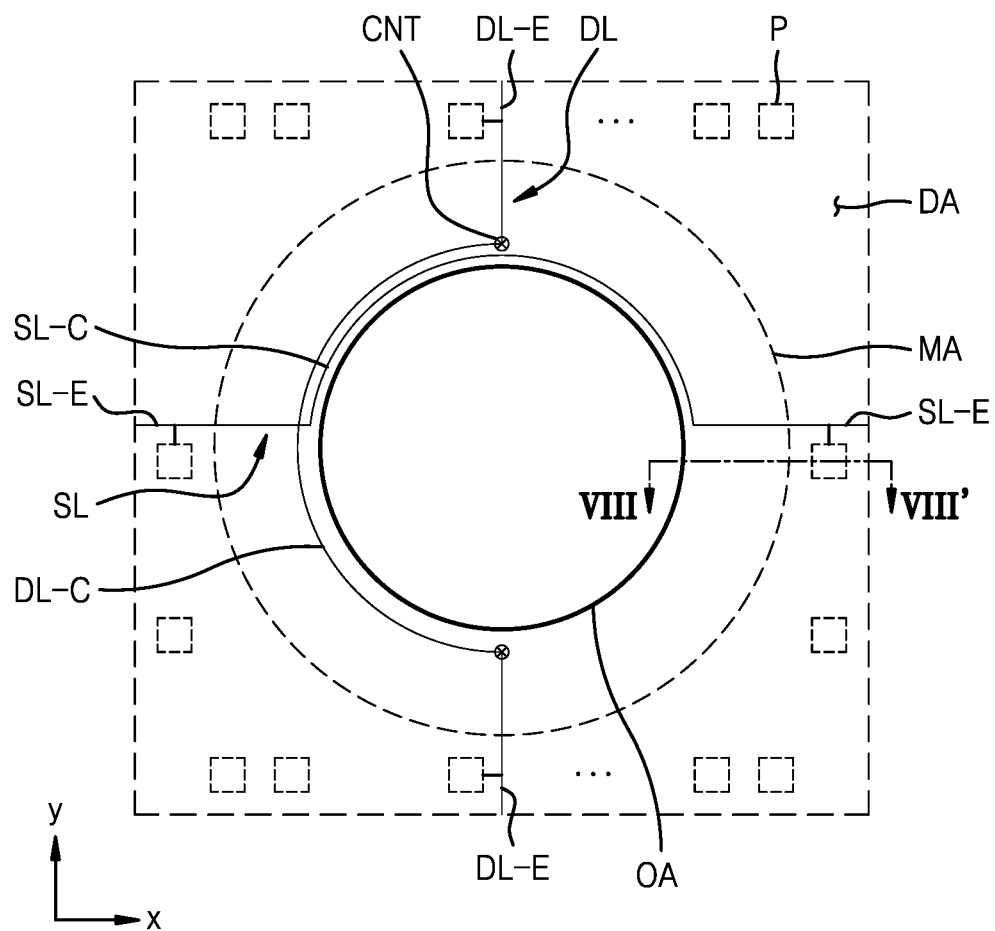
FIG. 7 is a plan view illustrating part of a display panel according to some embodiments.

FIG. 7 is a plan view illustrating part of a display panel according to some embodiments, and shows signal lines located in an intermediate area.

Referring to FIG. 7, pixels P are arranged in a display area DA around a first area OA. The pixels P may be spaced apart from each other with respect to the first area OA. In a plan view, the pixels P may be arranged over and under the first area OA, and the pixels P may be arranged on each of left and right sides of the first area OA.

Trace lines adjacent to the first area OA from among the trace lines configured to supply signals to the pixels P may bypass the first area OA. Some data lines DL among data lines passing through the display area DA may extend in a y direction as a whole so as to provide data signals to the pixels P arranged over and under the first area OA, and may detour along an edge of the first area OA in an intermediate area MA. In a plan view, some scan lines SL among scan lines passing through the display area DA may extend in an x direction as a whole so as to provide scan signals to the pixels P arranged at left and right sides of the first area OA, and may detour along the edge of the first area OA in the intermediate area MA. In FIG. 7, portions that are curved along the edge of the first area OA correspond to a detouring portion SL-C of the scan line SL and a detouring portion DL-C of the data line DL, respectively. The detouring portion SL-C of a scan line SL and an extension portion of the scan line SL crossing the display area DA may be formed as a single body on the same layer. The detouring portion DL-C of a data line DL and the extension portion of the data line DL crossing the display area DA may be formed on different layers from each other, and may be electrically connected to each other through a contact hole CNT.

Figure 8:
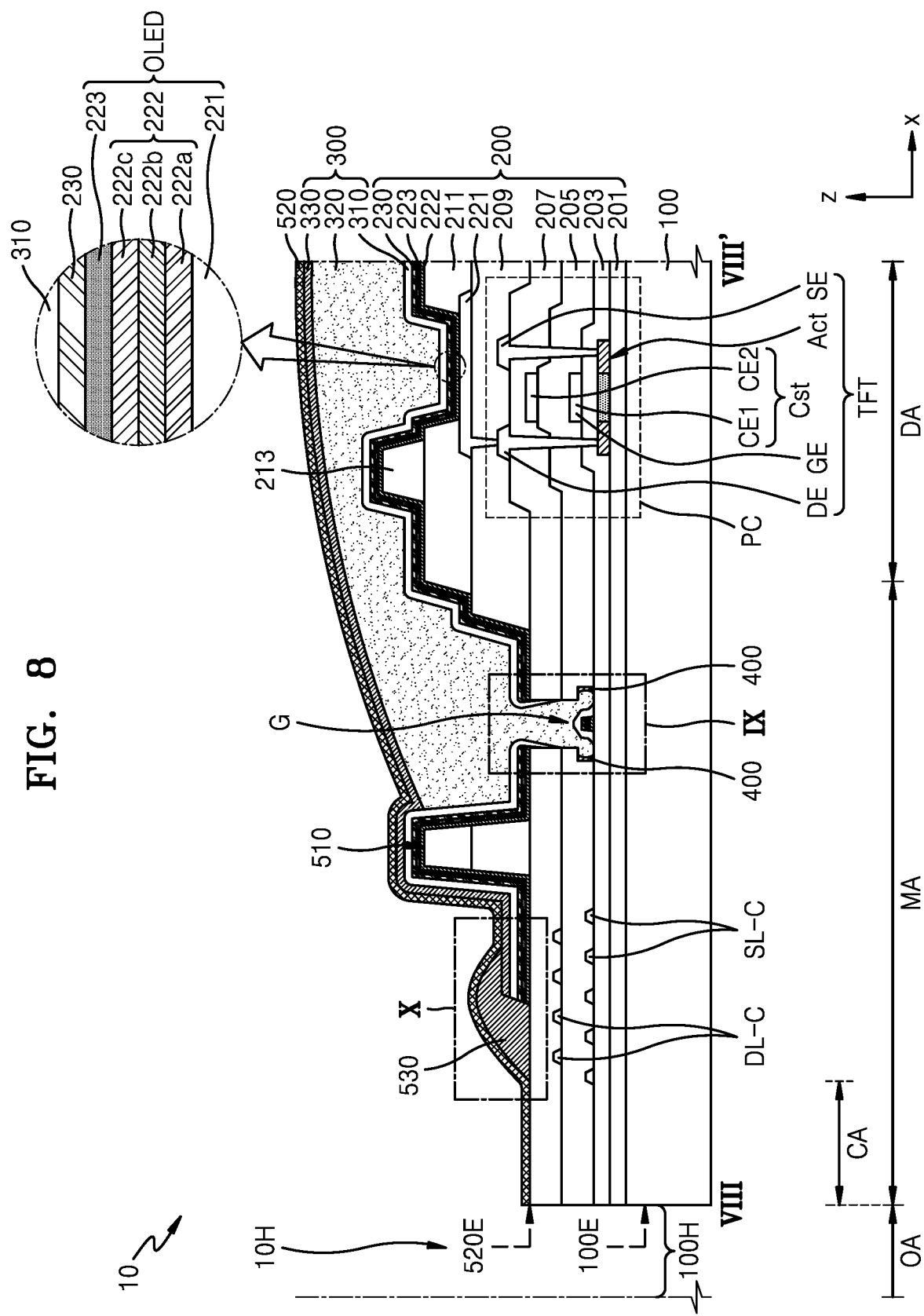
FIG. 8 is a cross-sectional view of a display panel according to some embodiments.
Figure 9A:
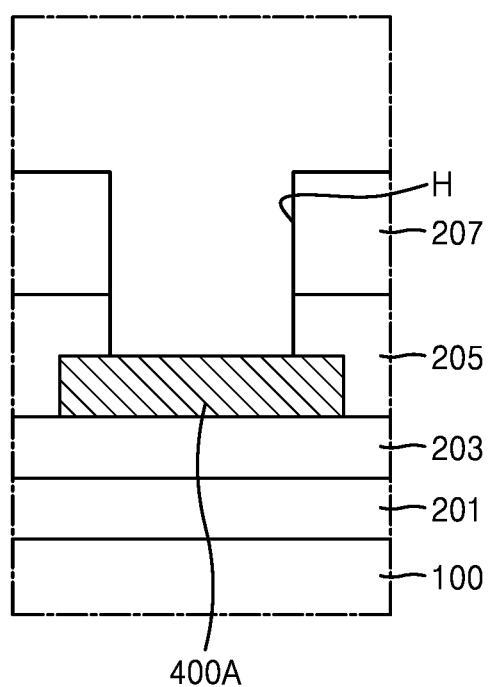
FIGS. 9A to 9D are cross-sectional views illustrating a process of manufacturing a display panel with a focus on a groove, according to some embodiments.
Figure 9B:
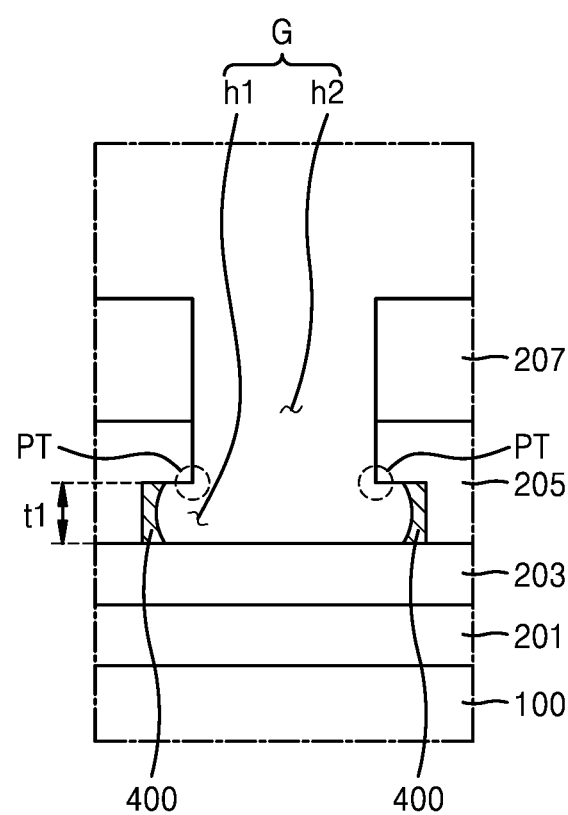
Figure 9C:
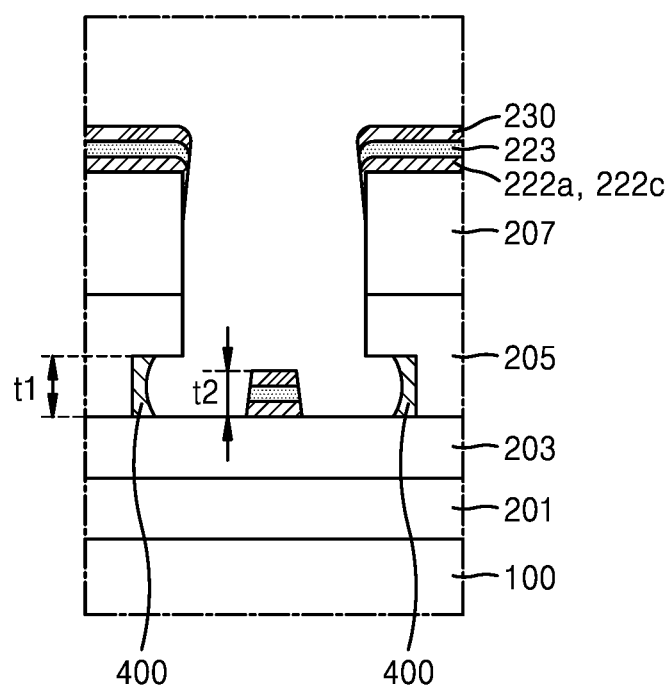
Figure 9D:
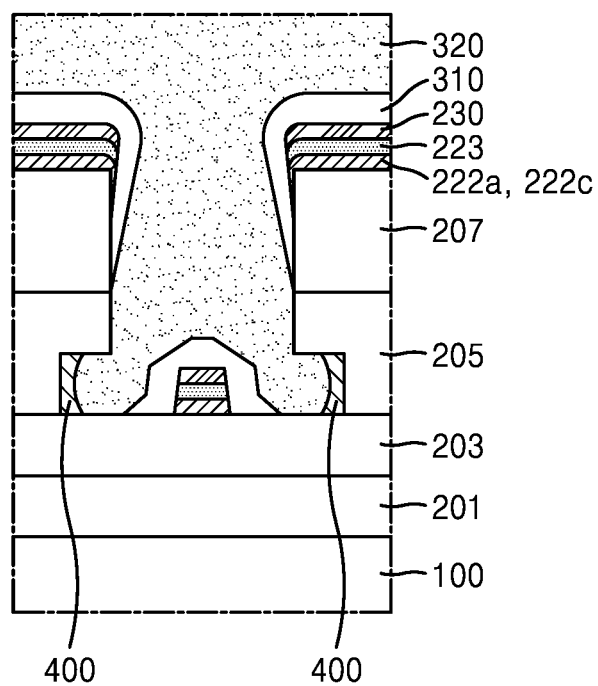
Figure 9E:
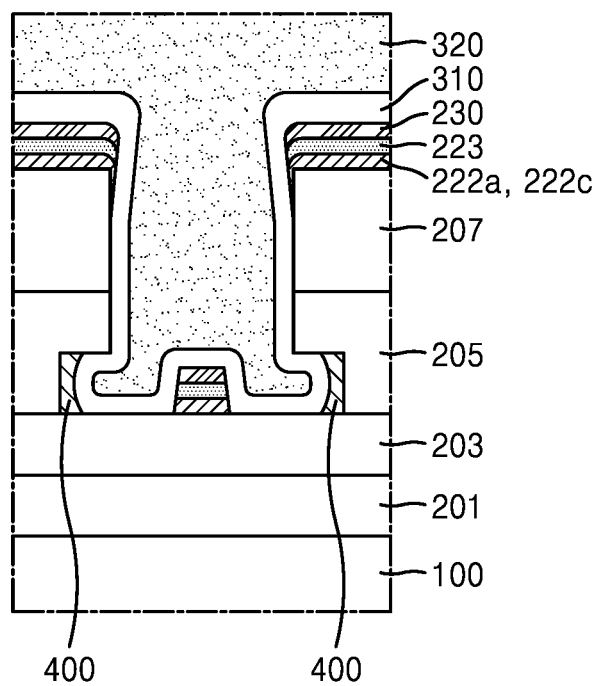
FIG. 9E is a modification of the embodiment of FIG. 9D.
Figure 10:
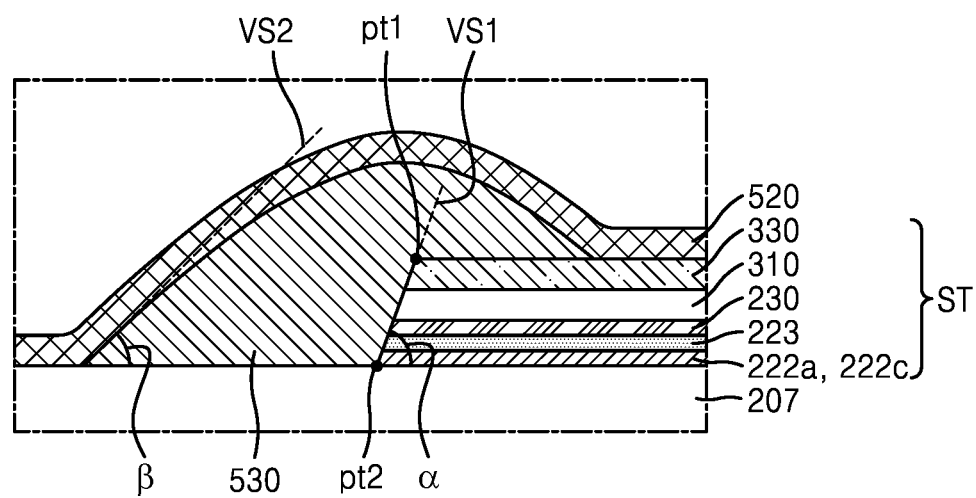
FIG. 10 is an enlarged cross-sectional view of the region X of FIG. 8.
Figure 11:
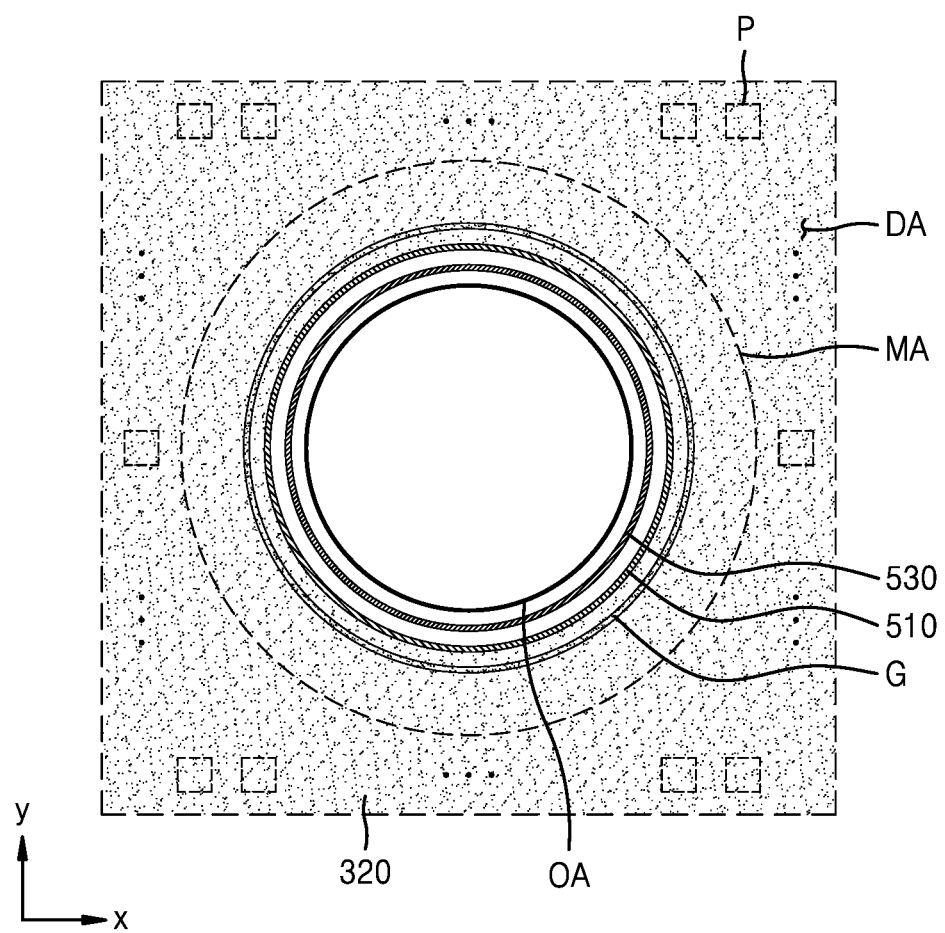
FIG. 11 is a plan view illustrating an element arranged in a first area and an intermediate area of a display panel according to some embodiments.

FIG. 8 is a cross-sectional view of a display panel taken along line VIII-VIII' in FIG. 7, according to some embodiments, FIGS. 9A to 9D are cross-sectional views of region IX in FIG. 8 and illustrate a manufacturing process with a focus on a groove of a display panel, according to some embodiments, FIG. 9E shows a modification of an embodiment of FIG. 9D, FIG. 10 is an enlarged cross-sectional view of region X in FIG. 8, FIG. 11 is a plan view illustrating elements arranged in a first area and an intermediate area of a display panel, according to some embodiments, and FIG.

12 is a cross-sectional view of a display panel according to some embodiments. For convenience of description, FIG. 11 shows a groove G, a partition wall 510, an organic encapsulation layer 320, and a cover layer 530 among elements of the a display panel.

Referring to a display area DA of FIG. 8, a substrate 100 may include a polymer resin. According to some embodiments, as described above with reference to FIG. 4A, the substrate 100 may include a multi-layer structure.

A buffer layer 201, which is formed to prevent impurities from infiltrating into a semiconductor layer Act of a thin-film transistor TFT, may be formed on the substrate 100. The buffer layer 201 may include an inorganic insulating material such as silicon nitride, silicon oxynitride, and silicon oxynitride, and may be a single layer or multiple layers including the inorganic insulating material described above.

A pixel circuit PC may be arranged on the buffer layer 201. The pixel circuit PC includes the thin-film transistor TFT and a storage capacitor Cst. The thin-film transistor TFT may include the semiconductor layer Act, a gate electrode GE, a source electrode SE, and a drain electrode DE. The thin-film transistor TFT shown in FIG. 8 may correspond to the driving thin-film transistor described above with reference to FIG. 6. According to some embodiments, it is shown a top gate-type transistor in which the gate electrode GE is arranged above the semiconductor layer Act with a gate insulating layer 203 therebetween, but according to some embodiments, the thin-film transistor TFT may be a bottom gate-type transistor.

The semiconductor layer Act may include polysilicon. Alternatively, the semiconductor layer Act may include amorphous silicon, oxide semiconductor, organic semiconductor, or the like. The gate electrode GE may include a low-resistance metal material. The gate electrode GE may include a conductive material including molybdenum (Mo), aluminum (Al), copper (Cu), titanium (Ti), etc., and may include a single layer or multiple layers including the above-described material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, hafnium oxide, and the like. The gate insulating layer 203 may be a single layer or multiple layers including the above-described material.

Each of the source electrode SE and the drain electrode DE may include a material having relatively good conductivity. Each of the source electrode SE and the drain electrode DE may include a conductive material including molybdenum (Mo), aluminum (Al), copper (Cu), titanium (Ti), etc., and may include a single layer or multiple layers including the above-described material. According to some embodiments, each of the source electrode SE and the drain electrode DE may have a multi-layer structure of a Ti layer, an Al layer, and another Ti layer.

The storage capacitor Cst may include a lower electrode CE1 and an upper electrode CE2 that overlap each other with a first interlayer insulating layer 205 therebetween. The storage capacitor Cst may overlap the thin-film transistor TFT. In this regard, FIG. 8 shows that the gate electrode GE of the thin-film transistor TFT is the lower electrode CE1 of the storage capacitor Cst. According to some embodiments, the storage capacitor Cst may not overlap the thin-film transistor TFT. The storage capacitor Cst may be covered with a second interlayer insulating layer 207. The upper electrode CE2 may include a conductive material including molybdenum (Mo), aluminum (Al), copper (Cu), titanium (Ti), etc., and may be a single layer or multiple layers including the above material.

Each of the first and second interlayer insulating layers 205 and 207 may include an inorganic insulating material such as silicon oxide, silicon nitride, silicon oxynitride, aluminum oxide, titanium oxide, tantalum oxide, and hafnium oxide. Each of the first and second interlayer insulating layers 205 and 207 may be a single layer or multiple layers including the above material.

The pixel circuit PC including the thin-film transistor TFT and the storage capacitor Cst may be covered with a planarization insulating layer 209. The planarization insulating layer 209 may include an approximately flat top surface. The planarization insulating layer 209 may include an organic material such as a general-purpose polymer such as polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blends thereof. According to some embodiments, the planarization insulating layer 209 may include polyimide. Alternatively, the planarization insulating layer 209 may include an inorganic insulating material, or may include inorganic and organic insulating materials.

A pixel electrode 221 may be formed on the planarization insulating layer 209. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compounds thereof. According to some embodiments, the pixel electrode 221 may further include a layer formed of ITO, IZO, ZnO, or $In_2O_3$ on/under the reflective layer.

A pixel-defining layer 211 may be formed on the pixel electrode 221. The pixel-defining layer 211 includes an opening through which an upper surface of the pixel electrode 221 is exposed, and may cover an edge of the pixel electrode 221. The pixel-defining layer 211 may include an organic insulating material. Alternatively, the pixel-defining layer 211 may include an inorganic insulating material such as silicon nitride ($SiN_x$), silicon oxynitride (SiON), or silicon oxide ($SiO_x$). Alternatively, the pixel-defining layer 211 may include an organic insulating material and an inorganic insulating material.

An intermediate layer 222 may include an emission layer 222b. The intermediate layer 222 may include a first functional layer 222a arranged below the emission layer 222b and/or a second functional layer 222c arranged above the emission layer 222b. The emission layer 222b may include a polymer or low-molecular weight organic material that emits light of a color.

The first functional layer 222a may be a single layer or multiple layers. For example, when the first functional layer 222a is formed of a polymer material, the first functional layer 222a may include a hole transport layer (HTL) having a single-layer structure, and may be formed of poly-(3,4)-ethylene-dihydroxy thiophene (PEDOT) or polyaniline (PANI). When the first functional layer 222a is formed of a low-molecular weight material, the first functional layer 222a may include a hole injection layer (HIL) and a hole transport layer (HTL).

The second functional layer 222c may be optional. For example, when the first functional layer 222a and the emission layer 222b are formed of a polymer material, it is desirable to form the second functional layer 222c. The second functional layer 222c may be a single layer or multiple layers. The second functional layer 222c may include an electron transport layer (ETL) and/or an electron injection layer (EIL).

The emission layer 222b of the intermediate layer 222 may be arranged for each pixel in the display area DA. The emission layer 222b may be patterned to correspond to the pixel electrode 221 that is exposed through the opening of the pixel-defining layer 211. Unlike the emission layer 222b, the first and second functional layers 222a and 222c of the intermediate layer 222 may be in an intermediate area MA as well as the display area DA.

An opposite electrode 223 may include a conductive material having a low work function. For example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloys thereof. Alternatively, the opposite electrode 223 may further include a layer such as an ITO layer, an IZO layer, a ZnO layer, or an $In_2O_3$ layer on the (semi) transparent layer including the above material. The opposite electrode 223 may be formed in the intermediate area MA as well as the display area DA. The intermediate layer 222 and the opposite electrode 223 may be formed by thermal evaporation.

A capping layer 230 may be located on the opposite electrode 223. For example, the capping layer 230 may include lithium fluoride (LiF) and may be formed by thermal evaporation. The capping layer 230 may be omitted.

A spacer 213 may be arranged on the pixel-defining layer 211. The spacer 213 may include an organic insulating material such as polyimide. Alternatively, the spacer 213 may include an inorganic insulating material such as silicon nitride or silicon oxide, or may include an organic insulating material and an inorganic insulating material.

The spacer 213 may include a material different from that of the pixel-defining layer 211. Alternatively, the spacer 213 and the pixel-defining layer 211 may include a same material, and in this case, the pixel-defining layer 211 and the spacer 213 may be formed together in a mask process using a half tone mask or the like. As an example, each of the pixel-defining layer 211 and the spacer 213 may include polyimide.

An organic light-emitting diode OLED is covered with a thin-film encapsulation layer 300. The thin-film encapsulation layer 300 may include at least one organic encapsulation layer and at least one inorganic encapsulation layer, and FIG. 8 shows that the thin-film encapsulation layer 300 includes first and second inorganic encapsulation layers 310 and 330 and an organic encapsulation layer 320 therebetween. According to some embodiments, the number of organic encapsulation layers, the number of inorganic encapsulation layers, and the stacked order may be changed.

Each of the first and the second inorganic encapsulation layers 310 and 330 may include one or more inorganic materials from among aluminum oxide, titanium oxide, tantalum oxide, hafnium oxide, zinc oxide, silicon oxide, silicon nitride, and silicon oxynitride. Each of the first and second inorganic encapsulation layers 310 and 330 may be a single layer or multiple layers including the above-described material. The organic encapsulation layer 320 may include a polymer-based material. The polymer-based material may include acryl-based resin, epoxy-based resin, polyimide, polyethylene, and the like. The first and second inorganic encapsulation layers 310 and 330 may have different thicknesses from each other. A thickness of the first inorganic encapsulation layer 310 may be greater than a thickness of the second inorganic encapsulation layer 330. For example, the thickness of the first inorganic encapsulation layer 310 may be about 1 μm, and the thickness of the second inorganic encapsulation layer 330 may be about 0.7 μm. Alternatively, the thickness of the second inorganic encapsulation layer 330 may be greater than the thickness of the first inorganic encapsulation layer 310, or the thicknesses of the first and second inorganic encapsulation layers 310 and 330 may be equal to each other.

Referring to the intermediate area MA of FIG. 8, a groove G having an undercut shape is located in the intermediate area MA. FIG. 8 shows that one groove G is arranged in the intermediate area MA, but according to some embodiments, two or more grooves may be arranged in the intermediate area MA.

Sub-layers of an inorganic material of the organic light-emitting diode OLED, for example, the intermediate layer 222, may be disconnected around the groove G in the intermediate area MA. According to some embodiments, the groove G may be formed using at least two or more layers including different materials from each other, and in this regard, FIG. 9A shows a metal layer 400A and first and second interlayer insulating layers 205 and 207 thereon Referring to FIG. 9A, a hole H is formed by removing a portion of the first and second interlayer insulating layers 205 and 207 on the metal layer 400A, and the metal layer 400A may be removed through the hole H. The metal layer 400A may be removed through an etching process, and as the metal layer 400A is removed, a first hole h1 having a relatively large width is formed where the metal layer 400A had been, as shown in FIG. 9B. A groove G may be formed by spatially connecting the first hole h1 to a second hole h2 formed thereon, and the second hole h2 may correspond to a hole H described with reference to FIG. 9A. A width of the second hole h2 is less than the width of the first hole h1, and the groove G may include a pair of tips PT (or an eave structure) protruding toward a center of the groove G. A metal material portion 400 (or residue) of the metal layer 400A that is not removed may remain in the first hole h1 as shown in FIG. 9B. In this regard, FIG. 9B shows that the metal material portion 400 is arranged under an edge of the first hole h1, for example, the pair of tips PT. According to some embodiments, all of the metal layer 400A may be removed, and in this case, unlike FIG. 9B, the metal material portion 400 may not be in the groove G. The metal layer 400A described with reference to FIG. 9A and the gate electrode GE include a same material and may be formed in a same process. For example, the metal layer 400A may include molybdenum (Mo).

Thereafter, in a process of forming the intermediate layer 222, a portion of the intermediate layers 222, for example, the first and second functional layers 222a and 222c, are disconnected around the groove G. A thickness t1 of the metal layer 400A corresponds to a depth of the first hole h1 forming the groove G, and the thickness t1 of the metal layer 400A may be greater than a sum t2 of thicknesses of the first and second functional layers 222a and 222c, the opposite electrode 223, and the capping layer 230 that are disconnected around the groove G.

The first and second functional layers 222a and 222c may be formed to entirely cover the display area DA and the intermediate area MA and may be disconnected by a groove G having an undercut structure. Similar to the first and second functional layers 222a and 222c, the opposite electrode 223 and the capping layer 230 including LiF, on the first and second functional layers 222a and 222c, may be formed by thermal evaporation, and the opposite electrode 223 and the capping layer 230 may be disconnected by the groove G having the undercut structure. An organic material included in a display panel may provide a path for moisture to penetrate. The first and second functional layers 222a and 222c include organic materials and may thus provide a path through which moisture penetrates. However, according to some embodiments, as described with reference to FIGS. 8A and 9A to 9C, the first and second functional layers 222a and 222c are disconnected around the groove G, and thus, the penetration of moisture through the first functional layer 222a and/or the second functional layer 222c may be prevented.

Referring to FIGS. 9D and 9E, after the first and second functional layers 222a and 222c, the opposite electrode 223, and the capping layer 230 are formed, a first inorganic encapsulation layer 310 is formed. Depending on a formation condition of the first inorganic encapsulation layer 310, etc., the first inorganic encapsulation layer 310 may be disconnected around the groove G, as shown in FIG. 9D, or may be continuously formed to entirely cover an inner surface of the groove G, as shown in FIG. 9E. The groove G may be at least partially filled with an organic encapsulation layer 320. The organic encapsulation layer 320 is located at one side of a partition wall 510. For example, an edge of the organic encapsulation layer 320 may be located at one side of the partition wall 510 adjacent to the display area DA, for example, on the right side of the partition wall 510 in FIG. 8. FIG. 8 shows that there is one partition wall 510, but according to some embodiments, the display panel 10 may include two or more partition walls 510.

With reference to FIGS. 8 and 9A to 9E, it is described that the metal layer 400A and the gate electrode GE are arranged on a same layer, but the present disclosure is not limited thereto. According to some embodiments, the location of the metal layer 400A of FIG. 9A may be changed in various ways, such as on the substrate 100, the buffer layer 201, or the first interlayer insulating layer 205, and accordingly, a depth of the groove G may be changed in various ways.

Referring to FIG. 8 again, an edge of each of the first and second functional layers 222a and 222c, the opposite electrode 223, and the capping layer 230 may be spaced apart from a first area OA by a distance. Similarly, an edge of each of the first and second inorganic encapsulation layers 310 and 330 on the opposite electrode 223 may be spaced apart from the first area OA by a distance.

An inorganic layer 520 may be on the thin-film encapsulation layer 300 and may be formed as a single body so as to entirely cover the display area DA and the intermediate area MA. In an area of the intermediate area MA adjacent to the first area OA, the inorganic layer 520 may directly contact an inorganic insulating layer under the thin-film encapsulation layer 300, for example, the second interlayer insulating layer 207. In other words, the above-described area adjacent to the first area OA corresponds to a contact area CA between the inorganic layer 520 and the second interlayer insulating layer 207 arranged under the thin-film encapsulation layer 300. In the contact area CA, the inorganic layer 520 including relatively moisture-resistant inorganic materials and the second interlayer insulating layer 207 directly contact each other, and thus, moisture may be prevented from penetrating in a direction parallel with the above-described contact surface (or lateral direction, an x direction of FIG. 8).

The inorganic layer 520 may include an inorganic insulating material. For example, the inorganic layer 520 may include silicon nitride, silicon oxide, and/or silicon oxynitride, and may be a single layer or multiple layers.

During the formation process of the inorganic layer 520, when a height difference between an upper surface of the second interlayer insulating layer 207 and an upper surface of the thin-film encapsulation layer 300, for example, an upper surface of the second inorganic encapsulation layer 330, is large, the inorganic layer 520 may be disconnected by a step between the upper surface of the second interlayer insulating layer 207 and the upper surface of the thin-film encapsulation layer 300. The disconnected portion of the inorganic layer 520 may provide a path through which moisture may permeate, and thus, to prevent this, the cover layer 530 covering a step may be further arranged.

Referring to FIGS. 8 and 10, a laminate ST stacked on the second interlayer insulating layer 207 may include the first and second functional layers 222a and 222c, the opposite electrode 223, the capping layer 230, and the first and second inorganic encapsulation layers 310 and 330. According to some embodiments, the second functional layer 222c and/or the capping layer 230 may be omitted as described above.

An edge of the laminate ST is spaced apart from the first area OA by a distance, and an edge of the thin-film encapsulation layer 300, for example, edges of the first and second inorganic encapsulation layers 310 and 330 are also spaced apart from the first area OA by a distance. During the manufacturing process, insulation layers of the laminate ST and the first and second inorganic encapsulation layers 310 and 330 of the thin-film encapsulation layer 300 may be entirely formed so as to cover the display area DA and the intermediate area MA. After the thin-film encapsulation layer 300 is formed, a photoresist may be formed on the second inorganic encapsulation layer 330 and portions of the laminate ST corresponding to the contact area CA may be removed by patterning using the photoresist as a mask. Insulations of the laminate ST and edges of the first and second inorganic encapsulation layers 310 and 330 may have substantially a same pattern. For example, in a cross-sectional view, the edge of insulations of the laminate ST and the edges of the first and second inorganic encapsulation layers 310 and 330 may be located on substantially a same line.

A side of the laminate ST may have a first slope α. Here, the first slope α may represent an angle formed by a virtual line VS1 and a bottom surface of the laminate ST (or an upper surface of the second interlayer insulating layer therebelow), wherein the virtual line VS1 connects an end point pt1 of an uppermost layer (e.g., a second inorganic encapsulation layer) of the laminate ST to an end point pt2 of a lowermost layer (e.g., a first functional layer) of the laminate ST. For example, the first slope α may have an angle in a range between about 60 degrees and about 80 degrees, for example, about 70 degrees.

A cover layer 530 may cover an edge of the laminate ST. A side surface of the cover layer 530 covering an inclined surface of the laminate ST may have a second slope β. The second slope β may represent an angle formed by a virtual line VS2 contacting the edge of the cover layer 530 and a bottom surface of the cover layer 530 (or the upper surface of the second interlayer insulating layer therebelow). The second slope β may be less than the first slope α. For example, the second slope β may range between about 55 degrees and about 65 degrees, or about 60 degrees or less. The cover layer 530 may include an organic insulating material.

The inorganic layer 520 may cover the entire intermediate area MA beyond the edge of the laminate ST and the edge of the cover layer 530, and as described above, may directly contact an inorganic insulating layer, for example, the second interlayer insulating layer 207 in the contact area CA.

When the display panel 10 includes the first opening 10H corresponding to the first area OA as shown in FIG. 8, each of the substrate 100 and layers on the substrate 100, for example, several layers from the buffer layer 201 to the inorganic layer 520 may include a hole corresponding to the first opening 10H. The substrate 100 may include a hole 100H corresponding to the first opening 10H, and an edge 520E of the inorganic layer 520 may be located on a same vertical line as a first edge 100E of the substrate 100 defining the above-described hole 100H.

The cross-sectional structure shown in FIG. 8 may correspond to a structure surrounding the first opening 10H and/or the first area OA. For example, as shown in FIG. 11, in a plan view, the groove G of the intermediate area MA may have a ring shape that surrounds the first area OA. Similarly, each of the partition wall 510 and the cover layer 530 may have a ring shape surrounding the first area OA. A detouring portion SL-C of the scan line SL and a detouring portion DL-C of the data line DL, which are lines shown in FIG. 8, may be between the groove G and a first edge 100E of the substrate 100. The detouring portion SL-C of the scan line SL and the detouring portion DL-C of the data line DL, which are shown in FIG. 8, correspond to the detouring portion SL-C of the scan line SL and the detouring portion DL-C of the data line DL described above with reference to FIG. 7, respectively.

Figure 12:
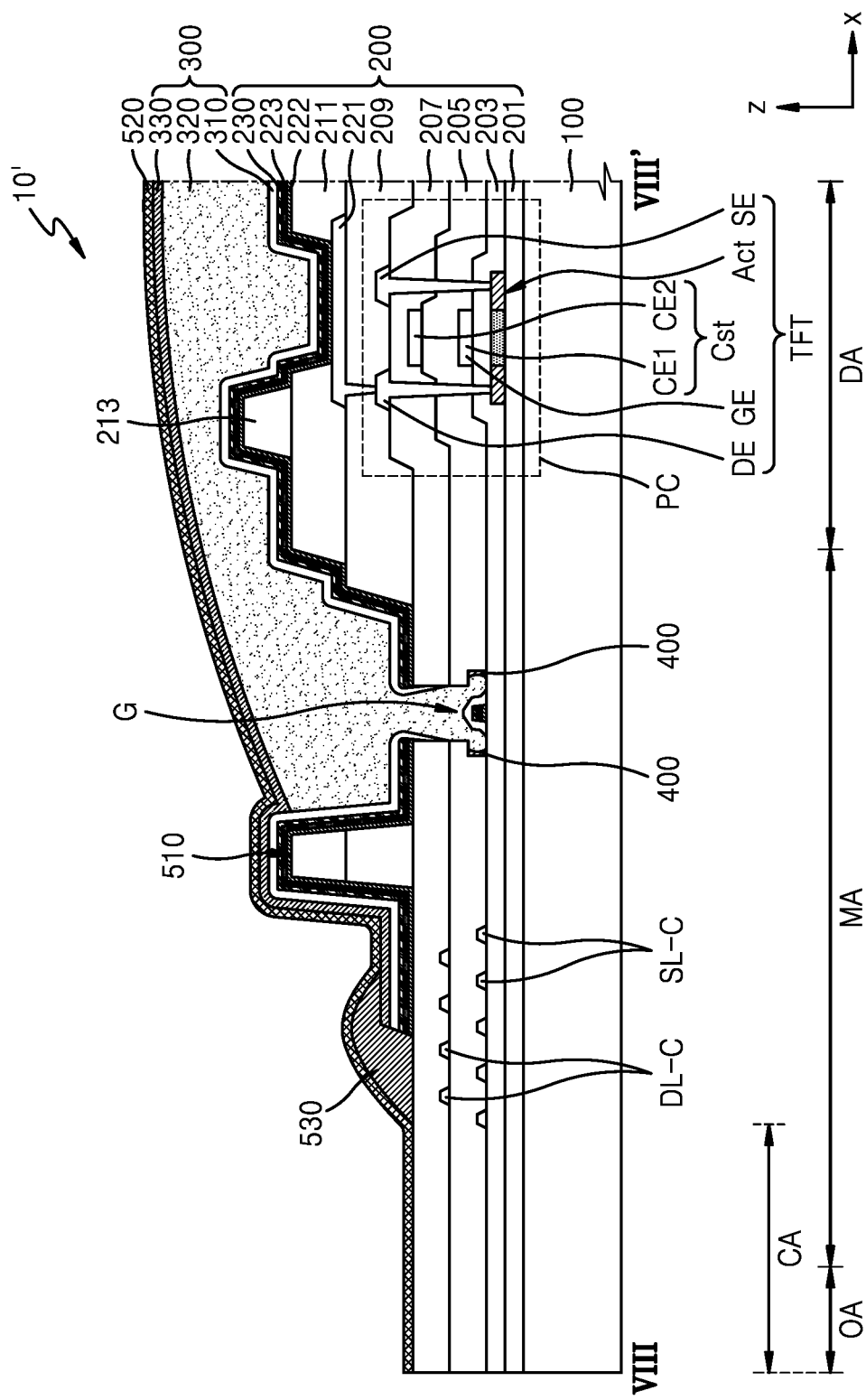
FIG. 12 is a cross-sectional view of a display panel according to some embodiments.

In FIG. 8, it is shown that a display panel 10 includes the first opening 10H corresponding to the first area OA, but according to some embodiments, as shown in FIG. 12, a display panel 10' may not include the first opening 10H.

Referring to FIG. 12, a portion of the substrate 100 corresponding to the first area OA may not be removed. In addition, a portion of a laminate from the buffer layer 201 to the second interlayer insulating layer corresponding to the first area OA may not be removed, either. The contact area CA between the inorganic layer 520 and the second interlayer insulating layer 207 shown in FIG. 12 may be greater than the contact area CA between the inorganic layer 520 and the second interlayer insulating layer 207 described with reference to FIG. 8. For example, as shown in FIG. 12, the inorganic layer 520 may contact the second interlayer insulating layer 207 in the first area OA. According to some embodiments, as described above with reference to FIG. 4D, a display element having a different structure or operating in a different manner from the organic light-emitting diode arranged in the display area DA may be arranged in the first area OA.

Figure 13:
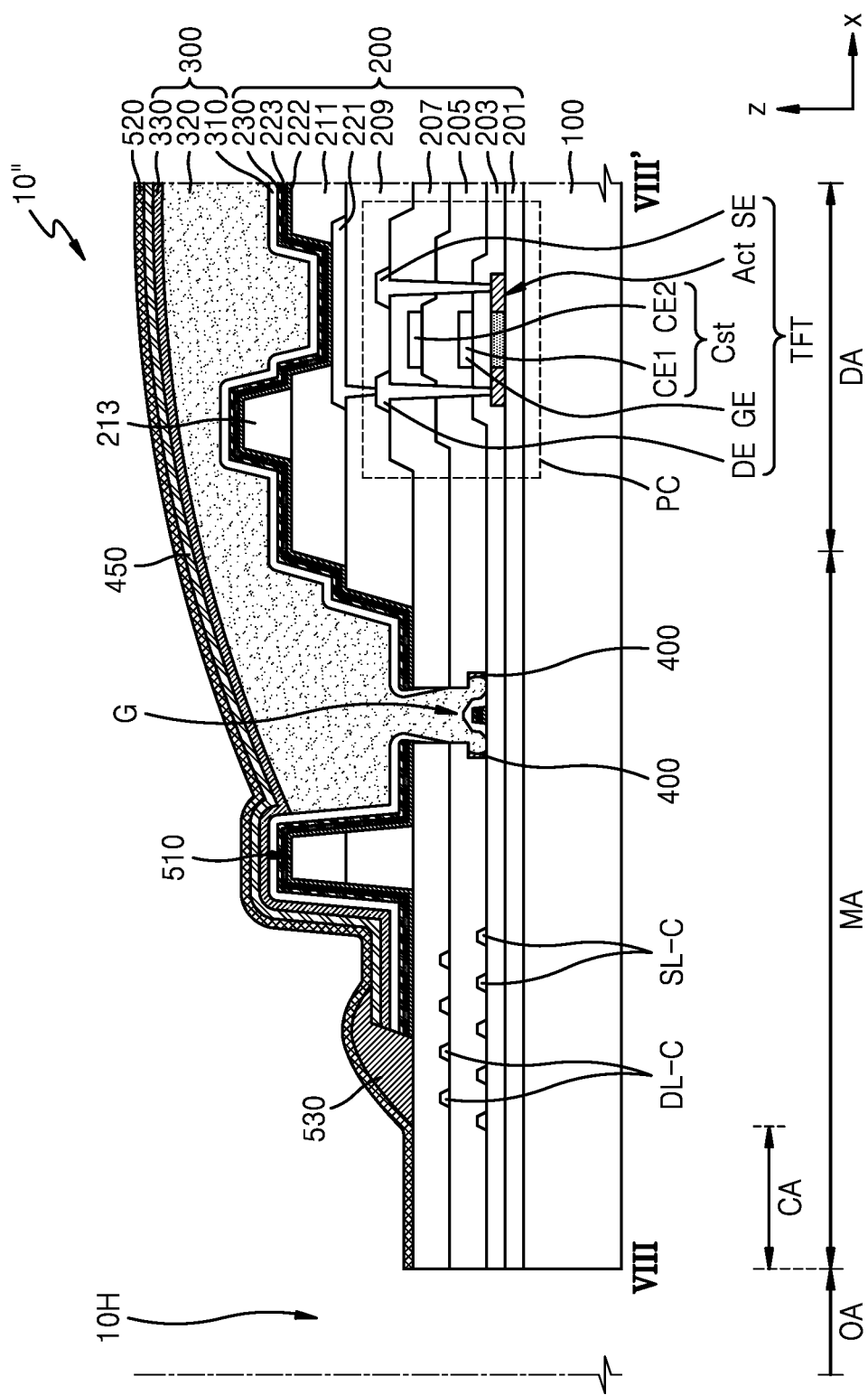
FIG. 13 is a cross-sectional view of a display panel according to some embodiments.

FIG. 13 is a cross-sectional view schematically illustrating a display panel according to some embodiments.

Features of a display panel 10" shown in FIG. 13 is same as those of the display panel 10 described above with reference to FIG. 8 except that the display panel 10" further includes a transparent layer 450 between the inorganic layer 520 and the thin-film encapsulation layer 300.

In order to form a contact area CA between the inorganic layer 520 and the second interlayer insulating layer 207 that is an insulating layer below the thin-film encapsulation layer 300, before the inorganic layer 520 is formed, a process of removing a portion of the laminate ST (see FIG. 10) formed in the intermediate layer MA as well as the display area DA and the first and second inorganic encapsulation layer 310 and 330 is necessary. The above-described removal process may be performed by using a photoresist including an organic material as a mask, and this case, when a transparent inorganic film that is not an organic material is used as a mask, the above-described transparent inorganic film remains on the second inorganic encapsulation layer 330 as it is, and thus, the transparent layer 450 may be formed.

The transparent layer 450 is an inorganic film and may include a transparent conductive oxide such as indium zinc oxide (IZO). Alternatively, the transparent layer 450 may include a light-transmitting metal thin film. An edge of the transparent layer 450 and an edge of the second inorganic encapsulation layer 330 may be located on a substantially same line.

FIG. 13 shows that the display panel 10" includes the first opening 10H corresponding to the first area OA, and each of the substrate 100 and the layers on the substrate 100, for example, several layers from the buffer layer 201 to the inorganic layer 520 also includes a hole corresponding to the first opening 10H, but the present disclosure is not limited thereto. The structure described with reference to FIG. 13 may be equally applied to the display panel 10' described above with reference to FIG. 12, and embodiments derived therefrom are also included in embodiments of the present disclosure.

Figure 14:
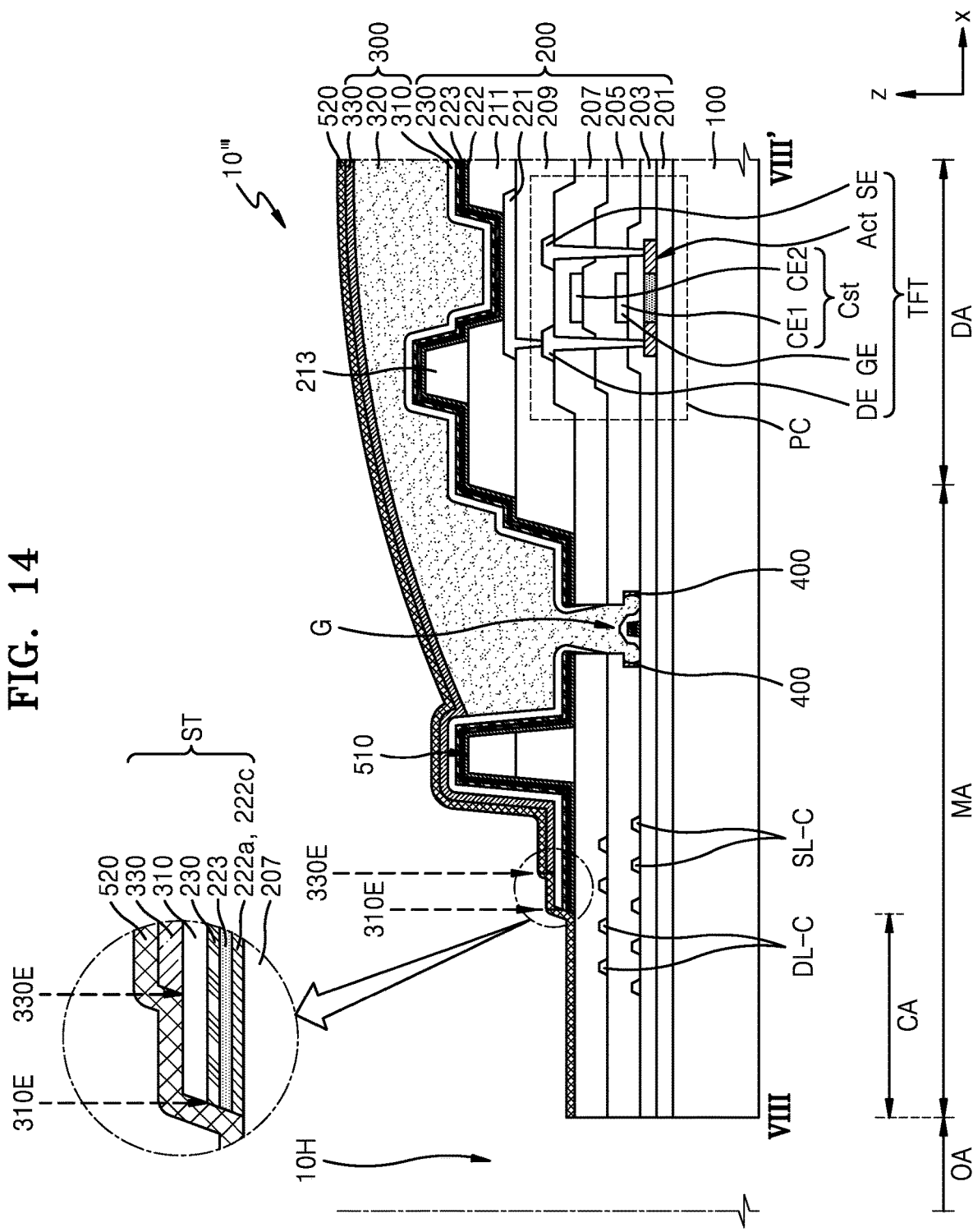
FIG. 14 is a cross-sectional view of a display panel according to some embodiments.
Figure 15:
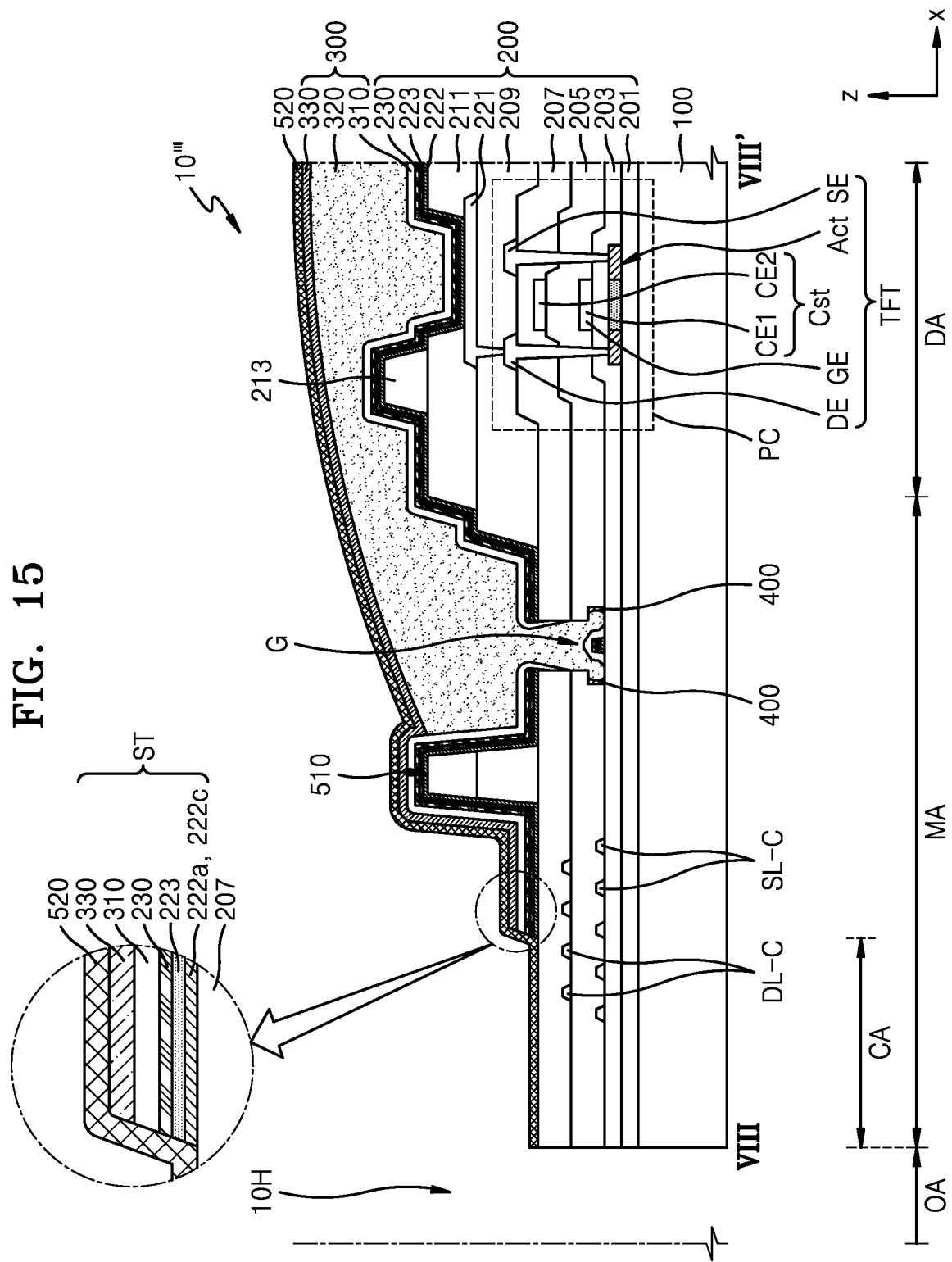
FIG. 15 is a cross-sectional view of a display panel according to some embodiments.

FIG. 14 is a cross-sectional view schematically illustrating a display panel according to some embodiments, and FIG. 15 is a cross-sectional view schematically illustrating a display panel according to some embodiments.

A display panel 10''' shown in FIG. 14 have same features as the display panel 10 described above with reference to FIG. 8 except that the cover layer 530 is not provided between the inorganic layer 520 and the thin-film encapsulation layer 300, and that the first inorganic encapsulation layer 310 and the second inorganic encapsulation layer 330 form a step.

Referring to FIG. 14, an edge 330E of the second inorganic encapsulation layer 330 may be located on an upper surface of the first inorganic encapsulation layer 310. The edge 330E of the second inorganic encapsulation layer 330 may be closer to the display area DA side than an edge 310E of the first inorganic encapsulation layer 310, and the first inorganic encapsulation layer 310 and the second inorganic encapsulation layer 330 may form a step.

Referring to the enlarged view of FIG. 14, a first step formed by the laminate ST and the first inorganic encapsulation layer 310 with respect to the upper surface of the second interlayer insulating layer 207 and a second step formed by the first inorganic encapsulation layer 310 and the second inorganic encapsulation layer 330 are arranged in a staircase-shape, and thus, the inorganic layer 520 may not be disconnected. In this case, a cover layer may not be provided between the inorganic layer 520 and the thin-film encapsulation layer 300.

The structure and feature(s) described with reference to FIG. 14 may be equally applied to the display panels 10' and 10" described above with reference to FIGS. 12 and 13, respectively, and an embodiment according thereto and an embodiment derived therefrom are included in embodiments of the present disclosure. For example, as shown in a display panel 10"" of FIG. 15, the inorganic layer 520 may extend toward the first area OA through the edge of the thin-film encapsulation layer 300, for example, the edges of the first inorganic encapsulation layer 310 and the second inorganic encapsulation layer 330, and the cover layer 530 (see FIG.

8, etc.) may not be between the thin-film encapsulation layer 300 and the inorganic layer 520. As shown in the enlarged view of FIG. 15, the edges of the first inorganic encapsulation layer 310 and the second inorganic encapsulation layer 330 may be located on a practically same inclined surface, and a step may not be formed between them. The inorganic layer 520 may cover an end portion of the laminate ST arranged therebelow (for example, an inclined surface of the laminate ST) and contact the upper surface of the second interlayer insulating layer 207 arranged below the laminate ST.

Figure 16:
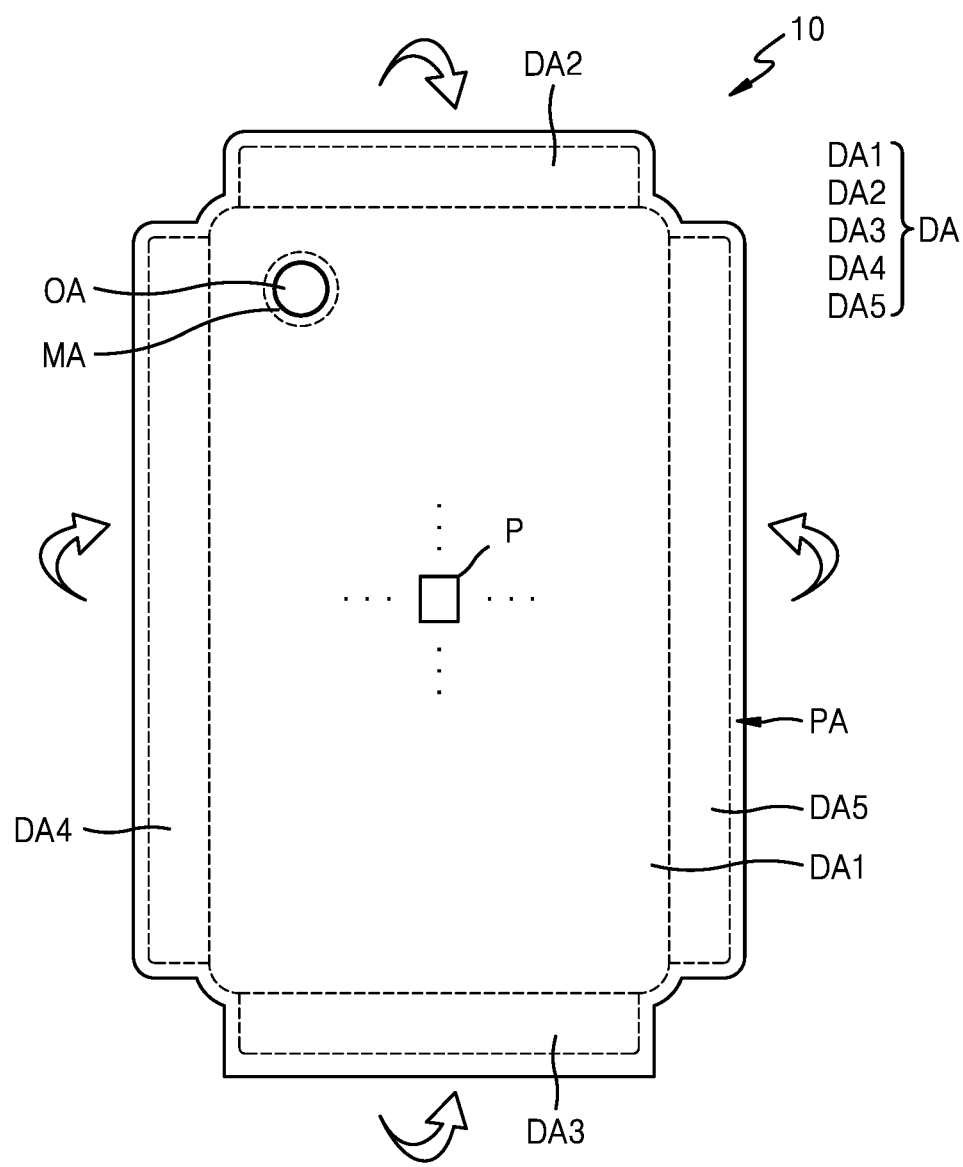
FIG. 16 is a plan view of a display panel according to some embodiments.
Figure 17:
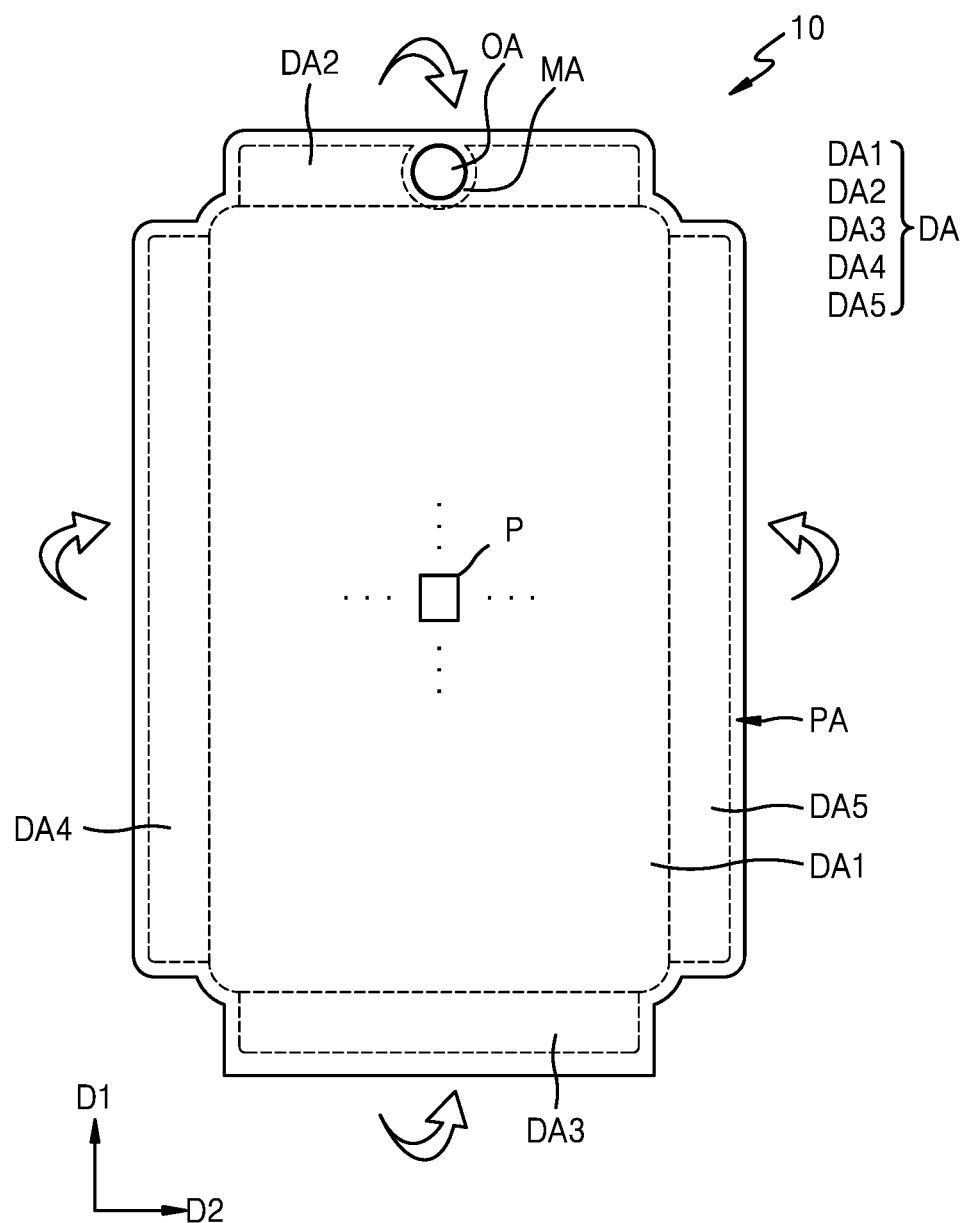
FIG. 17 is a plan view of a display panel according to some embodiments.

FIGS. 16 and 17 are plan views schematically illustrating a display panel according to some embodiments.

Referring to FIG. 16, a display area DA may include a first display area DA1 and second to fifth display areas DA2, DA3, DA4, and DA5 respectively arranged at edges of the first display area DA1. In FIG. 16, for convenience of description, a boundary between the first display area DA1 and each of the second to fifth display areas DA2, DA3, DA4, and DA5 is indicated by a dotted line, but a non-display area is not between the first display area DA1 and each of the second to fifth display areas DA2, DA3, DA4, and DA5.

As shown in FIG. 16, the first area OA may be located in the first display area DA1. Alternatively, as shown in FIG. 17, the first area OA may be located in the second display area DA2 and may be located at an edge of the second display area DA2. The first area OA located at the edge of the second display area DA2 may not be entirely surrounded by the second display area DA2 that is a display area, but may be partially surrounded by the second display area DA2. For example, an outer area PA may be above the first area OA, and the outer area PA and the intermediate area MA may be connected to each other.

Each of the second to fifth display areas DA2, DA3, DA4, and DA5 of the display panel 10 of FIGS. 16 and 17 may be bent with respect to the first display area DA1, and provide a three-dimensional display panel 10. The shape of the three-dimensional display panel 10 is not limited to the shape shown in FIGS. 16 and 17, and according to some embodiments, a display panel may be implemented to have various three-dimensional shapes such as a soccer ball shape, a pyramidal shape, and the like.

Figure 18:
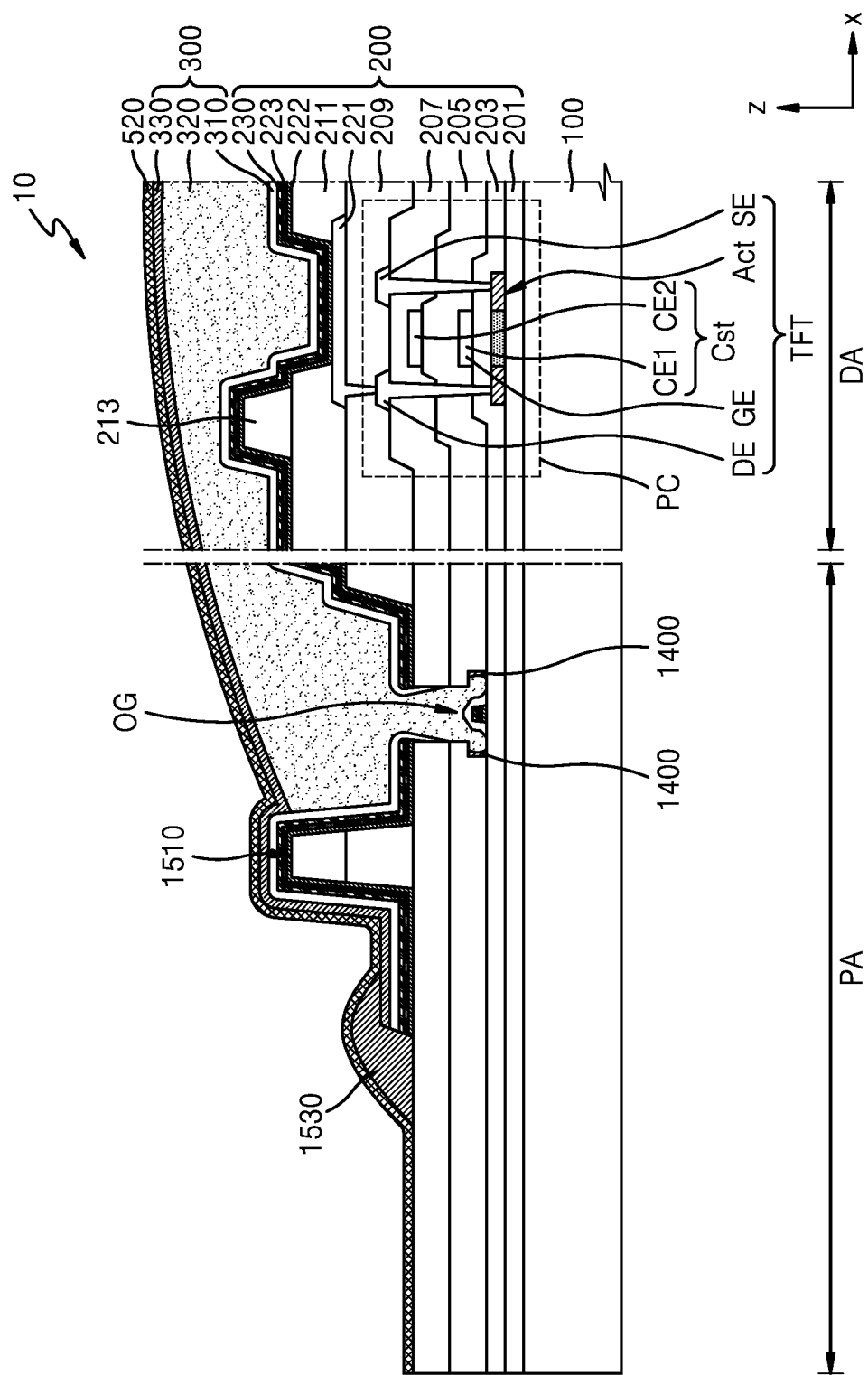
FIG. 18 is a cross-sectional view of a display panel according to some embodiments.

FIG. 18 is a cross-sectional view of a display panel according to some embodiments, in which an outer area and a display area are shown.

A display area DA of FIG. 18 and the display area DA described above with reference to FIG. 8 have a same structure. Referring to an outer area PA of FIG. 18, an outer groove OG is arranged in the outer area PA, and the outer groove OG may disconnect (or separate) an organic material layer, for example, an organic material included in a laminate forming an organic light-emitting diode (e.g., a laminate of a pixel electrode, an intermediate layer, and an opposite electrode). The outer groove OG and the groove G described with reference to FIG. 9A to 9D or 9E may be formed in a same process, and according to a process of forming the outer groove OG, a metal material portion 1400 (or residue) may be provided inside the outer groove OG, for example, below eaves. The structure in which the first functional layer 222a, the second functional layer 222c, the opposite electrode 223, and the capping layer 230, which are disconnected with respect to the outer groove OG, and/or the structure of the first inorganic encapsulation layer 310 are(is) same as those described above with reference to FIG. 8, 9A to 9D, or/and 9E.

An outer partition wall 1510 may be arranged in the outer area PA. A flow of monomers may be controlled by the outer partition wall 1510 during a manufacturing process of the organic encapsulation layer 320, and a thickness of the organic encapsulation layer 320 may be controlled. In a plan view, for example, when viewed from a direction perpendicular to the substrate 100, the outer partition wall 1510 may entirely surround the display area DA.

To prevent the inorganic layer 520 formed on a laminate on a laminated of the first functional layer 222a, the second functional layer 222c, the opposite electrode 223, and the capping layer 230, the first inorganic encapsulation layer 310, and the second inorganic encapsulation layer 330, which extend toward an outer edge of the substrate 100 via the outer partition wall 1510, from being disconnected by a step formed by the above-described laminate and an insulating layer therebelow (e.g., the second interlayer insulating layer 207), an outer cover layer 1530 may be provided. The outer cover layer 1530 may have a same material and/or same structure as the cover layer 530 described above.

FIG. 18 shows that a structure of elements arranged in the outer area PA, for example, the outer groove OG, the outer partition wall 1510, the outer cover layer 1530, and a laminate covered with the outer cover layer 1530 is same or similar as or to the structure of the groove G, the partition wall 510, the cover layer 530, and the laminate covered with the cover layer 530, but embodiments are not limited thereto. According to some embodiments, a structure of the outer groove OG, the outer partition wall 1510, the outer cover layer 1530, and the laminate covered with the outer cover layer 1530, which are arranged in the outer area PA, is substantially same or similar as or to the structure of the groove G, the partition wall 510, the cover layer 530, and the laminate covered with the cover layer 530 described above with reference to FIG. 13 or 14.

As described above, the present disclosure is described with reference to an embodiment shown in the drawings, but this is only an example, and it will be appreciated by those of ordinary skill in the art that various modifications and variations of the embodiment are possible therefrom. Therefore, the true technical protection scope of the present disclosure should be determined by the technical spirit of the appended claims.

The invention claimed is:

1. A display panel comprising:
 a substrate comprising a first area, a second area at least partially surrounding the first area, and an intermediate area between the first area and the second area;
 an insulating layer on the substrate;
 a plurality of display elements in the second area, and each comprising a pixel electrode, an opposite electrode, and an intermediate layer between the pixel electrode and the opposite electrode;
 a groove in the intermediate area;
 a thin-film encapsulation layer covering the plurality of display elements, and comprising an inorganic encapsulation layer and an organic encapsulation layer; and
 an inorganic layer over the thin-film encapsulation layer, wherein at least one sub-layer in the intermediate layer comprises a first portion and a second portion that are disposed in the intermediate area and disconnected around the groove to be separated from each other, one of the first portion and a second portion of the at least one sub-layer is disposed in the groove, and the inorganic layer directly contacts the insulating layer beyond an edge of the at least one sub-layer and an edge of the inorganic encapsulation layer that are located in the intermediate area.

2. The display panel of claim 1, wherein the insulating layer includes an inorganic insulating material.

3. The display panel of claim 1, wherein the opposite electrode is disconnected around the groove.

4. The display panel of claim 3, wherein the edge of the at least one sub-layer, an edge of the opposite electrode, and the edge of the inorganic encapsulation layer are spaced apart from the first area.

5. The display panel of claim 1, wherein a portion of the organic encapsulation layer is in the groove.

6. The display panel of claim 1, wherein the at least one sub-layer comprises at least one of a hole transport layer, a hole injection layer, an electron transport layer, or an electron injection layer.

7. The display panel of claim 1, further comprising:
a cover layer below the inorganic layer and covering the edge of the at least one sub-layer and the edge of the inorganic encapsulation layer.

8. The display panel of claim 7, wherein the cover layer includes an organic insulating material.

9. The display panel of claim 7, wherein, in a plan view, the cover layer has a ring shape that surrounds the first area.

10. The display panel of claim 7, wherein an angle of an inclined surface of the cover layer covering the edge of the at least one sub-layer and the edge of the inorganic encapsulation layer is less than an angle of an inclined surface formed by the edge of the at least one sub-layer and the edge of the inorganic encapsulation layer.

11. The display panel of claim 1, further comprising
a transparent layer between the inorganic layer and the thin-film encapsulation layer.

12. The display panel of claim 11, wherein the thin-film encapsulation layer further comprises an upper inorganic encapsulation layer on the inorganic encapsulation layer with the organic encapsulation layer therebetween, and
an edge of the upper inorganic encapsulation layer forms a step with the edge of the inorganic encapsulation layer.

13. A display panel comprising:
a substrate comprising a first area, a second area at least partially surrounding the first area, and an intermediate area between the first area and the second area;
an insulating layer on the substrate;
a plurality of display elements in the second area, and each comprising a pixel electrode, an opposite electrode, and an intermediate layer between the pixel electrode and the opposite electrode;
a groove in the intermediate area;
a thin-film encapsulation layer covering the plurality of display elements; and
an inorganic layer over the thin-film encapsulation layer,
wherein at least one sub-layer included in the intermediate layer comprises a first portion and a second portion that are disposed in the intermediate area and disconnected around the groove to be separated from each other, one of the first portion and a second portion of the at least one sub-layer is disposed in the groove, and the inorganic layer extends toward the first area beyond an edge of the at least one sub-layer located in the intermediate area and an edge of the thin-film encapsulation layer.

14. The display panel of claim 13, wherein the thin-film encapsulation layer comprises a first inorganic encapsulation layer, an organic encapsulation layer on the first inorganic encapsulation layer, and a second inorganic encapsulation layer on the organic encapsulation layer, and
the inorganic layer directly contacts the insulating layer beyond an edge of the first inorganic encapsulation layer and an edge of the second inorganic encapsulation layer.

15. The display panel of claim 14, wherein an edge of the organic encapsulation layer is closer to the second area than the edge of the first inorganic encapsulation layer and the edge of the second inorganic encapsulation layer.

16. The display panel of claim 14, wherein the edge of the second inorganic encapsulation layer forms a step with the edge of the first inorganic encapsulation layer.

17. The display panel of claim 13, wherein the at least one sub-layer comprises at least one of a hole transport layer, a hole injection layer, an electron transport layer, or an electron injection layer.

18. The display panel of claim 13, wherein the opposite electrode is disconnected around the groove, and an edge of the opposite electrode is spaced apart from the first area by a distance.

19. The display panel of claim 18, wherein the inorganic layer covers the edge of the opposite electrode.

20. The display panel of claim 13, further comprising:
a cover layer covering the edge of the thin-film encapsulation layer.

21. The display panel of claim 20, wherein the cover layer is between the inorganic layer and the edge of the thin-film encapsulation layer.

22. The display panel of claim 20, wherein the cover layer has a ring shape that surrounds the first area in a plan view.

23. The display panel of claim 22, wherein, in the plan view, the cover layer has a ring shape surrounding the first area, and the groove is closer to the second area than the cover layer.

24. The display panel of claim 13, further comprising:
a transparent layer between the inorganic layer and the thin-film encapsulation layer, wherein an edge of the transparent layer is spaced apart from the first area.

25. The display panel of claim 24, wherein the inorganic layer covers the edge of the transparent layer.

* * * * *